United States Patent
Johnson

(10) Patent No.: US 7,257,143 B2
(45) Date of Patent: Aug. 14, 2007

(54) MULTICOMPONENT BARRIER LAYERS IN QUANTUM WELL ACTIVE REGIONS TO ENHANCE CONFINEMENT AND SPEED

(75) Inventor: Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 495 days.

(21) Appl. No.: 10/956,798

(22) Filed: Oct. 1, 2004

(65) Prior Publication Data

US 2005/0129078 A1 Jun. 16, 2005

Related U.S. Application Data

(63) Continuation-in-part of application No. 10/352,293, filed on Jan. 27, 2003, now abandoned, and a continuation-in-part of application No. 10/026,020, filed on Dec. 27, 2001, now Pat. No. 6,975,660, and a continuation-in-part of application No. 10/026,044, filed on Dec. 27, 2001, now Pat. No. 7,058,112, and a continuation-in-part of application No. 10/026,016, filed on Dec. 20, 2001, now Pat. No. 7,095,770, and a continuation-in-part of application No. 10/026,019, filed on Dec. 20, 2001, and a continuation-in-part of application No. 10/026,055, filed on Dec. 20, 2001, now Pat. No. 6,922,426, which is a continuation-in-part of application No. 09/217,223, filed on Dec. 21, 1998, now Pat. No. 6,603,784.

(51) Int. Cl.
*H01S 5/00* (2006.01)

(52) U.S. Cl. .................... 372/50.1; 372/43.01

(58) Field of Classification Search ............ 372/43.01, 372/46.01, 75, 96
See application file for complete search history.

(56) References Cited

U.S. PATENT DOCUMENTS 75,920 A 3/1868 Uüwohl (Continued)

FOREIGN PATENT DOCUMENTS

EP 0 606 821 A 7/1994

(Continued)

OTHER PUBLICATIONS

U.S. Appl. No. 10/931,194, filed Aug. 31, 2004, Ralph H. Johnson et al.

(Continued)

*Primary Examiner*—Minsun Oh Harvey
*Assistant Examiner*—Tuan N. Nguyen
(74) *Attorney, Agent, or Firm*—Workman Nydegger

(57) ABSTRACT

Multi-component barrier layers include formation of a GaAs layer and at least one adjacent GaAsN layer. The resulting multi-component barrier layer shape can provide enhanced (extended) offset for capture of holes and enhanced electrons. Other benefits include: a small amount of strain compensation; poorer spatial overlap of higher confined states reducing parasitics at high bias, with some small effect on the lowest confined states. Quantum wells and associated barriers layers can be grown with combinations of gallium, (Ga), arsenic, (As), nitrogen (N), aluminum (Al), antimony (Sb), phosphorous (P) and/or indium (In) placed within or about a typical GaAs substrate to achieve long wavelength VCSEL performance, e.g., with wavelengths over 1200 nm. Layers of strained quantum well material can also be supported by mechanical stabilizers.

23 Claims, 30 Drawing Sheets

U.S. PATENT DOCUMENTS

| | | |
|---|---|---|
| 4,445,218 A | 4/1984 | Coldren |
| 4,608,697 A | 8/1986 | Coldren |
| 4,622,672 A | 11/1986 | Coldren et al. |
| 4,829,347 A | 5/1989 | Cheng et al. |
| 4,873,696 A | 10/1989 | Coldren et al. |
| 4,896,325 A | 1/1990 | Coldren |
| 5,040,186 A | 8/1991 | Logan et al. |
| 5,045,499 A | 9/1991 | Nishizawa et al. |
| 5,082,799 A | 1/1992 | Holmstrom et al. |
| 5,229,627 A | 7/1993 | Kosaka |
| 5,245,622 A | 9/1993 | Jewell et al. |
| 5,251,225 A | 10/1993 | Eglash et al. |
| 5,293,392 A | 3/1994 | Shieh et al. |
| 5,343,487 A | 8/1994 | Scott et al. |
| 5,358,880 A | 10/1994 | Lebby et al. |
| 5,365,540 A | 11/1994 | Yamanaka |
| 5,383,211 A | 1/1995 | Van de Walle et al. |
| 5,392,307 A | 2/1995 | Sugiyama et al. |
| 5,408,487 A | 4/1995 | Uchida et al. |
| 5,416,044 A | 5/1995 | Chino et al. |
| 5,422,901 A | 6/1995 | Lebby et al. |
| 5,468,343 A | 11/1995 | Kitano |
| 5,491,710 A | 2/1996 | Lo |
| 5,513,204 A | 4/1996 | Jayaraman |
| 5,559,818 A | 9/1996 | Shono et al. |
| 5,568,504 A | 10/1996 | Kock et al. |
| 5,583,351 A | 12/1996 | Brown et al. |
| 5,588,995 A | 12/1996 | Sheldon |
| 5,631,472 A | 5/1997 | Cunningham et al. |
| 5,693,180 A | 12/1997 | Furukawa et al. |
| 5,719,891 A | 2/1998 | Jewell |
| 5,719,894 A | 2/1998 | Jewell et al. |
| 5,719,895 A | 2/1998 | Jewell et al. |
| 5,729,567 A | 3/1998 | Nakagawa |
| 5,732,103 A | 3/1998 | Ramdani et al. |
| 5,747,366 A | 5/1998 | Brillouet et al. |
| 5,754,578 A | 5/1998 | Jayaraman |
| 5,757,833 A | 5/1998 | Arakawa et al. |
| 5,760,939 A | 6/1998 | Nagarajan et al. |
| 5,780,867 A | 7/1998 | Fritz et al. |
| 5,805,624 A | 9/1998 | Yang et al. |
| 5,809,051 A | 9/1998 | Oudar |
| 5,815,524 A | 9/1998 | Ramdani et al. |
| 5,818,862 A | 10/1998 | Salet |
| 5,825,796 A | 10/1998 | Jewell et al. |
| 5,832,018 A | 11/1998 | Ohkubo |
| 5,835,521 A | 11/1998 | Ramdani et al. |
| 5,841,152 A * | 11/1998 | Ishikawa .................... 257/14 |
| 5,877,038 A | 3/1999 | Coldren et al. |
| 5,880,028 A | 3/1999 | Yamamoto et al. |
| 5,883,912 A * | 3/1999 | Ramdani et al. ......... 372/45.01 |
| 5,898,722 A | 4/1999 | Ramdani et al. |
| 5,903,586 A * | 5/1999 | Ramdani et al. ......... 372/45.01 |
| 5,912,913 A | 6/1999 | Kondow et al. |
| 5,943,357 A | 8/1999 | Lebby et al. |
| 5,943,359 A | 8/1999 | Ramdani et al. |
| 5,956,363 A | 9/1999 | Lebby et al. |
| 5,960,018 A | 9/1999 | Jewell et al. |
| 5,974,073 A | 10/1999 | Canard et al. |
| 5,978,398 A | 11/1999 | Ramdani et al. |
| 5,985,683 A | 11/1999 | Jewell |
| 5,991,326 A | 11/1999 | Yuen et al. |
| 6,002,705 A | 12/1999 | Thornton |
| 6,008,525 A | 12/1999 | Barron et al. |
| 6,021,147 A | 2/2000 | Jiang et al. |
| 6,046,065 A | 4/2000 | Goldstein et al. |
| 6,046,096 A | 4/2000 | Ouchi |
| 6,049,556 A | 4/2000 | Sato |
| 6,052,398 A | 4/2000 | Brillouet et al. |
| 6,057,560 A | 5/2000 | Uchida |
| 6,061,380 A | 5/2000 | Jiang et al. |
| 6,061,381 A | 5/2000 | Adams et al. |
| 6,100,546 A | 8/2000 | Major et al. |
| 6,121,068 A | 9/2000 | Ramdani et al. |
| 6,127,200 A | 10/2000 | Ohiso et al. |
| 6,148,016 A | 11/2000 | Hegblom et al. |
| 6,195,485 B1 | 2/2001 | Coldren et al. |
| 6,207,973 B1 | 3/2001 | Sato et al. |
| 6,252,894 B1 | 6/2001 | Sasanuma et al. |
| 6,252,896 B1 | 6/2001 | Tan et al. |
| 6,314,118 B1 | 11/2001 | Jayaraman et al. |
| 6,341,137 B1 | 1/2002 | Jayaraman et al. |
| 6,359,920 B1 | 3/2002 | Jewell et al. |
| 6,362,069 B1 | 3/2002 | Forrest et al. |
| 6,363,092 B1 | 3/2002 | Botez et al. |
| 6,366,597 B1 | 4/2002 | Yuen et al. |
| 6,372,533 B2 | 4/2002 | Jayaraman et al. |
| 6,424,669 B1 | 7/2002 | Jiang et al. |
| 6,434,180 B1 | 8/2002 | Cunningham |
| 6,542,530 B1 | 4/2003 | Shieh et al. |
| 6,621,842 B1 | 9/2003 | Dapkus |
| 2002/0034203 A1 | 3/2002 | Shimizu |
| 2002/0067748 A1 | 6/2002 | Coldren et al. |
| 2002/0071464 A1 | 6/2002 | Coldren et al. |
| 2002/0071471 A1 | 6/2002 | Kim et al. |
| 2002/0075920 A1 | 6/2002 | Spruytte et al. |
| 2002/0075929 A1 | 6/2002 | Cunningham |
| 2002/0090016 A1 | 7/2002 | Coldren et al. |
| 2002/0131462 A1 | 9/2002 | Line et al. |
| 2003/0013223 A1 | 1/2003 | Ramdani et al. |
| 2003/0039287 A1 | 2/2003 | Takahashi |
| 2003/0053510 A1 | 3/2003 | Yuen et al. |

FOREIGN PATENT DOCUMENTS

| | | |
|---|---|---|
| EP | 0 702 101 | 3/1996 |
| EP | 0 740 377 A1 | 10/1996 |
| EP | 0 740 377 B | 10/1996 |
| EP | 0 765 014 A1 | 3/1997 |
| EP | 0 822 630 A1 | 2/1998 |
| EP | 0 874 428 A2 | 10/1998 |
| EP | 0 874 428 B1 | 10/1998 |
| EP | 0 874 428 A3 | 11/1998 |
| EP | 0 896 406 A | 2/1999 |
| EP | 0 765 014 B1 | 7/1999 |
| EP | 0 975 073 A1 | 1/2000 |
| EP | 1 182 756 | 2/2002 |
| EP | 1 294 063 A1 | 3/2003 |
| JP | 57026492 A | 2/1982 |
| JP | 08 139404 | 5/1996 |
| WO | WO 98/007218 A1 | 2/1998 |
| WO | WO 00/052789 A2 | 2/2000 |
| WO | WO 00/52789 A3 | 2/2000 |
| WO | PCT/US99/26496 | 3/2000 |
| WO | WO 00/033433 A2 | 6/2000 |
| WO | WO 00/033433 A3 | 6/2000 |
| WO | WO 00/038287 A1 | 6/2000 |
| WO | WO 00/065700 A2 | 11/2000 |
| WO | WO 00/065700 A3 | 11/2000 |
| WO | WO 01/016642 A2 | 3/2001 |
| WO | WO 01/016642 A3 | 3/2001 |
| WO | WO 01/017076 A2 | 3/2001 |
| WO | WO 01/017076 A3 | 3/2001 |
| WO | WO 01/018919 A1 | 3/2001 |
| WO | WO 01/024328 A2 | 4/2001 |
| WO | WO 01/024328 A3 | 4/2001 |
| WO | WO 01/033677 A2 | 5/2001 |
| WO | WO 01/033677 A3 | 5/2001 |
| WO | WO 01/052373 A2 | 7/2001 |
| WO | WO 01/084682 A2 | 11/2001 |
| WO | WO 01/093387 A2 | 12/2001 |
| WO | WO 01/093387 A3 | 12/2001 |
| WO | WO 01/095444 A2 | 12/2001 |
| WO | WO 01/098756 A2 | 12/2001 |

| | | | |
|---|---|---|---|
| WO | WO 02/003515 A2 | 1/2002 | |
| WO | WO 02/017445 A1 | 2/2002 | |
| WO | WO 02/084829 A1 | 10/2002 | |

OTHER PUBLICATIONS

U.S. Appl. No. 10/931,162, filed Aug. 21, 2004, Ralph H. Johnson et al.

U.S. Appl. No. 10/956,985, filed Oct. 1, 2004, Ralph H. Johnson.

International Search Report, dated Mar. 27, 2003, relative to PCT application No. PCT/US02/39414, the foreign equivalent to the instant U.S. Appl. No. 10/026,055.

International Search Report, dated Apr. 9, 2003, regarding PCT International application PCT/US02/39912, the PCT equivalent of U. S. Appl. No. 10/026,044.

Notification of Transmittal of the International Search Report or the Declaration, dated Jan. 15, 2004, relative to PCT. Application No. PCT/US02/41736, the foreign equivalent to the instant U.S. Appl. No. 10/026,016.

Notification of Transmittal of the International Search Report or the Declaration dated Jan. 2, 2004, relative to PCT. Application No. PCT/US02/39604, the foreign equivalent to the instant U.S. Appl. No. 10/026,019.

Notification of Transmittal of the International Search Report or the Declaration, dated Jan. 2, 2004, relative to PCT Application No. PCT/US02/39821. the foreign equivalent to the instant U.S. Appl. No. 10/026,020.

Almuneau, G., et al., "Accurate control of Sb composition in AlGaAsSb alloys on InP substrates by molecular beam epitaxy", article, Journal of Crystal Growth, vol. 208, May 6, 1999, pp. 113-116.

Almuneau, G., et al., "Improved electrical and thermal properties of InP-AlGaAsSb Bragg mirrors for long-wavelength vertical-cavity laser", article, IEEE Photonics Technology Letters, Vo. 12, No. 10, Oct. 2000, pp. 1322-1324.

Almuneau, G., et al., "Molecular beam epitaxial growth of monolithic 1.55 μm vertical cavity surface emitting lasers with AlGaAsSb/AlAsSb Bragg mirrors", article, Journal of Vacuum Science Technology, vol. 8, No. 3, May/Jun. 2000, pp. 1601-1604.

Anan, T., et al., "Continuous-wave operation of 1.30 μm GaAsSb/GaAs VCSELs", article, Electronics Letters, vol. 37, No. 9, Apr. 26, 2001, pp. 566-567.

Black, K., et al. "Doulbe-fused 1.5 μm vertical cavity lasers with record high $T_o$ of 132K at room temperature", article, Electronics Letters, vol. 34, No. 20, Oct. 1, 1998, pp. 1947-1949.

Blum, O., et al., "Electrical and optical characteristics of AlAsSb/BaAsSb distributed Bragg reflectors for surface emitting laser", article, Applied Physics Letters, vol. 67, No. 22, Nov. 27, 1995, pp. 3233-3235.

Blum, O., et al., "Highly reflective, long wavelength AlAsSb/GaAsSb distributed Bragg reflector grown by molecular beam epitaxy on InP substrates", article, Applied Physics Letters, Vo. 66, No. 3, Jan. 16, 1995, pp. 329-331.

Boucart, J., et al., "1mW CW-RT monolithic VCSEL at 1.55 μm", article, IEE Photonic Technology Letters, vol. 11, No. 6, Jun. 1999, pp. 629-631.

Campbell, J., et al., "Quantum dot resonant cavity photodiode with operation near 1.3 μm wavelength", article, Electronics Letters, vol. 33, No. 15, Jul. 17, 1997, pp. 1337-1339.

Chang, C., et al., "Parasitics and design considerations on oxide-implant VCSELs", article, IEEE Photonics Technology Letters, vol. 13, Mo 12, Dec. 2001, pp. 1274-1276.

Choquette, K., et al., "Room temperature continuous wave InGaAsN quantum well vertical-cavity lasers emitting at 1.3 μm", article, Electronics Letters, vol. 36, No. 16, Aug. 3, 2000, pp. 1388-1390.

Chua et al., "Low Threshold 1.57 μm VC-SEL's Using Strain-Compensated Quantum Wells and Oxide/Metal Backmirror", IEEE Photonics Technology Letters, 7 (1995) May, No. 5, pp. 444-446.

Dowd, P., et al., "Long wavelength (1.3 and 1.5 μm) photoluminescence from InGaAs/GaPAsSb quantum wells grown on GaAs", article, Applied Physics Letters, vol. 75, No. 9, Aug. 30, 1999, pp. 1267-1269.

Dudley, J., et al., "Water fused long wavelength vertical cavity lasers", conference proceedings, LEOS '93 Conference Proceedings. IEEE Lasers and Electro-Optics Society 1993 Annual Meeting, Nov. 15/8, 1993, pp. 560-561.

Gourley, F., et al., "Epitaxial semiconductor optical interference devices", invited paper, SPIE, vol. 792, 1987, pp. 178-189.

Guden, M., et al., "Material parameters of quaternary III-V semiconductors for multiplayer mirrors at 1.55 μm wavelength", Modeling Simulation Material Science Engineering, vol. 4, 1966, pp. 349-357.

Guo, C., et al., "Theoretical investigation of strained InGaAs/GaPAsSb type-II quantum wells on GaAs for long wavelength (1.3 μm) optoelectronic devices", post-conference paper, Dept of Electrical Engineering & Center for Solid State Electronics Research, ASU, Tempe, AZ, Apr. 1999, pp. 30-31.

Guy, D., et al., "Theory of an electro-optic modulator based on quantum wells in a semiconductor etalon", conference paper, Quantum Well and Superlattice Physics, Mar. 23/4, 1987, pp. 189-196.

Hall, E., et al., "Electrically-pumped, single-epitaxial VCSELs at 1.55 μm with Sb-based mirrors", article, Electronics Letters, vol. 35, No. 16, Aug. 5, 1999, pp. 1-2.

Hall, E., et al., "Increased lateral oxidation rates of AlInAs on InP using short-period superlattices", article, Applied Physics Letters, vol. 29, No. 9, Jan. 8, 2002, pp. 1100-1104.

Hall, E., et al., "Selectively etched undercut apertures in AlAsSb-based VCSELs", article, IEEE Photonics Technology Letters, vol. 13, No. 2, Feb. 2001, pp. 97-99.

Hegblom, E., et al., "Small efficient vertical cavity lasers with tapered oxide apertures", article, Electronics Letters, vol. 34, No. 9, Apr. 30, 1998, pp. 895-896.

Heroux, J., et al., "Optical investigation of InGaAsN/GaAs strained multi-quantum wells", 20th North American Conference on Molecular Beam Epitaxy, Oct. 1-3, 2001, p. 2.

Hong, Y., et al., "Improving Ga(In)Nas properties by migration-enhanced epitaxy and superlattices", 43rd 2001 Electronic Material Conferences, Session G, Paper G10, Jun. 27, 2001.

Hong, Y., et al., "Growth of GaInNAs quaternaries using a digital allow technique", conference paper, Journal of Vacuum Science and Technology B: Microelectronics and Nanometer Structures, Oct. 1/3, 2001, pp. 1163-1166.

Horikoshi, Yoshiji, et al. "Low-Temperature Growth of GaAs and AiAs-GaAs Quantum-Well Layers by Modified Molecular Beam Epitaxy," Japanese Journal of Applied Physics, NTT Electrical Communications Laboratories, Tokyo, vol. 25, No. 10, Oct. 1986, pp. L868-L870.

Huffacker, D., et al., "1.5 μm wavelength oxide-confined quantum-dot vertical-cavity surface-emitting laser", article, IEEE Photonics Technology Letters, vol. 10, No. 2, Feb. 1998, pp. 185-187.

Huffaker, D., et al., "1.3 μm room-temperature GaAs-based quantum-dot laser", Applied Physics Letters, vol. 73, No. 18, Nov. 2, 1998, pp. 2564-2566.

IGA, K., "Semiconductor laser in the 21st century", California conference papers, Photodetectors: Materials and Devices VI, Jan. 22/4, 2001, pp. xi-xxv.

Jayaraman, V., et al., "Uniform threshold current, continuous-wave, singlemode 1300 nm vertical cavity lasers from 0 to 70°C", article, Electronics Letters, vol. 34, No. 14, Jul. 9, 1998, pp. 1405-1407.

Kim, J., et al., "Epitaxially-stacked multiple-active-region 1.55 μm lasers for increased differential efficiency", article, Applied Physics Letters, vol. 74, No. 22, May 31, 1999, pp. 3251-3253.

Kim, J., et al., "Room-temperature, electrically-pumped multiple-active-region VCSELs with high differential efficiency at 1.55 μm", article, Electronics Letters, vol. 35, No. 13, Jun. 24, 1999, pp. 1-2.

Kotaki, Y., et al., "GaInAsP/InP surface emitting laser with two active layers", article, Extended Abstracts of the 16th (1984 International) conference on Solid State Devices and Materials, pp. 133-136.

Kouichi, Kushi, et al. "High Speed Growth of Device Quality GaN and InGaN by RF-MBE," Materials Science and Engineering B59, Department of Electrical and Electronic Engineering, Sophia University (1999), pp. 65-68.

Koyama, F., et al., "1.5 W Operation of Superluminescent Diode with Highly Strained GaInAs/GaAs Quantum Well Emitting at 1.2

µm Band," Microsystem Research Center, P & I Laboratory, Tokyo Institute of Technology, pp. 71-72.

Koyama, F., et al., "Room temperature CWS operation of GaAs vertical cavity surface emitting laser", article, The Transactions of the IEICE, vol. E71, No. 11, Nov. 1988, pp. 1089-1090.

Larson, J., et al., "GaInNAs-GaAs long-wavelength vertical-cavity surface-emitting laser diodes", article, IEEE Photonics Technology Letters, vol. 10, No. 2, Feb. 1998, pp. 188-190.

Lee, Y., et al., "Physics and nonlinear device applications of bulk and multiple quantum well GaAs", invited paper, SPIE vol. 792 Quantum Well and Superlattice Physics (1987), pp. 128-133.

Li, J., et al., "Persistent photoconductivity in $Ga_{1-x}In_xN_yAs_{1-y}$", article, Applied Physics Letters, vol. 75, No. 13, Sep. 27, 1999, pp. 1899-1901.

Livshits, D., et al., "8W continuous wave operation of InGaAsN lasers of 1.3 µm", article, Electronics Letters, vol. 36, No. 16, Aug. 3, 2000, pp. 1381-1382.

Mayer and Lau, Electronic Material Science: For Integrated Circuits in Si and GaAs 1990, Macmillan Publishing Company.

Mirin, R., et al., "1.3 µm photoluminescence from InGaAs quantum dots on GaAs", article, Applied Physics Letter 67 (25), Dec. 18, 1995, pp. 3795-3797.

Miyamoto, T., et al., "A novel galnnas-gaas quantum-well structure for long-wavelength semiconductor lasers" IEEE photonics technology letter, IEE Inc. New York, US vol. 9, No. 11, Nov. 1, 1997 pp. 1448-1450.

Nakagawa, S., et al., "I.55 µm InP-lattice-matched VCSELs with AlGaAsSb-AlAsSb DBRs", article, IEEE Journal on Selected Topics in Quantum Electronics, vol. 7, No. 2, Mar./Apr. 2001, pp. 224-230.

Nakahara, K., et al., "1.3 µm continuous-wave lasing operation in GaInNAs quantum-well lasers", article, IEEE Photonics Technology Letters, vol. 10, No. 4, Apr. 1998, pp. 487-488.

Naone, R., et al., "Tapered air apertures for thermally robust VCL structures", article, IEEE Photonics Technology Letters, vol. 111, No. 11, Nov. 1999, pp. 1339-1341.

Nelson, D., et al., "Band nonparabolicity effects in semiconductor quantum wells", article, Rapid Communications, vol. 35, No. 17, Feb. 15, 1987, pp. 7770-7773.

Ohnoki, N., et al., "Superlattice AlAs/AlInAs-oxide current aperture for long wavelength InP-based vertical-cavity surface-emitting laser structure", article, Applied Physics Letters, vol. 73, No. 22, Nov. 30, 1998, pp. 3262-3264.

Ortsiefer, M., et al., "Submiliamp long-wavelength InP-based vertical-cavity surface-emitting laser with stable linear polarization", article, Electronics Letters, vol. 36, No. 13, Jun. 22, 2000, pp. 1124-1126.

Peters, M., et al., "Realization and modeling of a pseudomorphic $(GaAs_{1-x}Sb_xIn_yGa_{1-y}As)/GaAs$ bilayer-quantum well", article, Applied Physics Letter 67 (18), Oct. 30, 1995, pp. 263941.

Peters, M., et al., "Band-gap engineered digital alloy interfaces for lower resistance vertical-cavity surface-emitting lasers", article, Applied Physics Letters, vol. 63, No. 25, Dec. 1993, pp. 3411-3413.

Piprek, J., et al., "Thermal comparison of long-wavelength vertical-cavity surface-emitting laser diodes", Electronics Letters, May 26, 1994, vol. 30, No. 11, pp. 866-868.

Piprek, J., et al., "Minimum temperature sensitivity of 1.55 µm vertical-cavity lasers at -30 nm gain offset", article, Applied Physics Letters, vol. 72, No. 15, Apr. 13, 1998, pp. 1814-1816.

Raja, M., et al., "Novel wavelength-resonant optoelectronic structure and its application to surface-emitting semiconductor lasers", article, Electronics Letters, Sep. 1, 1998, vol. 24, No. 18, pp. 1140-1142.

Scott, J., et al., "High efficiency submilliamp vertical cavity lasers with intracavity contacts", article, IEEE Photonics Technology Letters, vol. 16, No. 6, Jun. 1994, pp. 678-680.

Sekiguchi, S., et al., "Long wavelength GaInAsP/InP laser with n-n contacts using AlAs/InP hole injecting tunnel junction", article, Japanese Journal of Applied Physics, Part 2, No. 4B, Apr. 15, 1999, pp. L443-445.

Shimizu, H., et al., "High-Performance CW 1.26-MUM Gainassb-SQW ridge lasers" IEEE journal of selected topics in quantum electronics, IEEE service center, US, vol. 7, No. 2, Mar. 2001, pp. 355-364.

Sohn, H., et al., "A New Approach to Grow Strain-Free GAAS on SI", Materials Research Society Symposium Proceedings, Jan. 1, 1991, XP000578836, figure 4.

Starck, C., "Long wavelength VCSEL with tunnel junction and metamorphic AlAs/GaAs conductive DBR", article, Physics Review B, vol. 39, No. 3, Jan. 15, 1989, pp. 1871-1883.

Sugimoto, M., et al., "Surface emitting devices with distributed Bragg reflectors grown by highly precise molecular beam epitaxy", article, Journal of Crystal Growth, vol. 127, 1993, pp. 1-4.

Uchida, T., et al., "CBE grown 1.5 µm GaInAsP-InP surface emitting lasers", article, IEEE Journal of Quantum Electronics, vol. 29, No. 6, Jun. 1993, pp. 1975-1980.

Van De Walle, C. "Band lineups and deformation potentials in the model-solid theory", article, Physical Review B, vol. 29, No. 3, Jan. 15, 1989, pp. 1871-1883.

Whitaker, T., "Long wavelengths VCSELs move closer to reality", article, Compound Smiconducotr, Jul. 2000, pp. 65-67.

Yamada, M., et al., "Low-threshold lasing at 1.3 µm from GaAsSb quantum wells directly grown on GaAs substrates", article, IEEE, 0-7803-4947, Apr. 1998, pp. 149-150.

Yamada, M., et al., "Room temperature low-threshold CW operation of 1.23 µm GaAsSb VCSELs on GaAs substrates", article, Electronics Letters, Mar. 30, 2000, vol. 36, No. 7, pp. 637-638.

Yang, X., et al., "High performance 1.3 µm InGaAsN:Sb/GaAs quantum well lasers grown by molecular beam epitaxy", journal article, Journal of Vacuum Science and Technology B Microelectronics and Nanometer Structures, Vo. 18, No. 3, Oct. 1999, pp. 1484-1487.

Yang, X., et al., "High-temperature characteristics of 1.3 mum InGaAsN:Sb/GaAs multiple-quantum-well lasers grown by molecular-beam epitaxy", article, Applied Physics Letters, vol. 76, No. 7, Feb. 14, 2000, pp. 795-797.

Yang, X., et al., "InGaAsNSb/GaAs quantum wells for 1.55 µm lasers grown by molecular-beam epitaxy", article, Applied Physics Letters, vol. 78, No. 26, pp. 4068-4070.

Yano, M., et al., "Time-resolved reflection high energy electron diffraction analysis for atomic layer depositions fo GaSb by molecular beam epitaxy", article, Journal of Crystal Growth, vol. 146, 1995, pp. 349-353.

Yuen, W., et al., "High-performance 1.6 µm single-epitaxy top-emitting VCSEL", article, Electronics Letters, vol. 36, No. 13, Jun. 22, 2000, pp. 1121-1123.

\* cited by examiner

MULTICOMPONENT BARRIER LAYERS IN QUANTUM WELL ACTIVE REGIONS TO ENHANCE CONFINEMENT AND SPEED

CROSS-REFERENCE TO RELATED APPLICATIONS

This application is a continuation-in-part of application Ser. No. 10/352,293, filed Jan. 27, 2003 now abandoned, which is a continuation-in-part to the following U.S. patent applications: application Ser. No. 09/217,223, filed Dec. 21, 1998, now U.S. Pat. No. 6,603,784; application Ser. No. 10/026,016, filed Dec. 20, 2001 now U.S. Pat. No. 7,095,770; application Ser. No. 10/026,019, filed Dec. 20, 2001; application Ser. No. 10/026,055, filed Dec. 20, 2001 now U.S. Pat. No. 6,922,426; application Ser. No. 10/026,044, filed Dec. 27, 2001 now U.S. Pat. No. 7,058,112; and application Ser. No. 10/026,020, filed Dec. 27, 2001 now U.S. Pat. No. 6,975,660, each of the foregoing being incorporated by reference herein in their entireties.

BACKGROUND OF THE INVENTION

1. The Field of the Invention

The present invention generally relates to systems and methods for producing vertical cavity surface emitting lasers (VCSELs). The present invention is also related to utilizing combinations of nitrogen (N), aluminum (Al), antimony (Sb), phosphorous (P) and/or indium (In) as a material system and as a means to increase VCSEL device wavelength longer than 1200 nanometers (nm) using ordinary MOCVD or MBE equipment. The present invention more particularly relates to development of a VCSEL using migration enhanced epitaxy (MEE) in processing InGaAs, InGaAsN, InGaAsNSb, GaAsNSb AlGaAsNSb and/or other combinations.

2. The Relevant Technology

Solid-state semiconductor lasers are important devices in applications such as optoelectronic communication systems and high-speed printing systems. There has been an increased interest in VCSELs although edge emitting lasers are currently used in the vast majority of applications. A reason for growing interest in VCSELs is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. By contrast, not only does the beam of a VCSEL have a small angular divergence, a VCSEL emits light normal to the surface of the wafer. Additionally, because VCSELs generally incorporate mirrors monolithically in their design, they allow for on-wafer testing and the fabrication of one-dimensional or two-dimensional laser arrays.

VCSELs are typically made by growing several layers on a substrate material. VCSELs include a first mirrored stack formed on the substrate, an active region formed on top of the first mirrored stack, and a second mirrored stack formed on top of the active region. By providing a first contact on top of the second mirrored stack, and a second contact on the backside of the substrate, a current is forced through the active region, thus driving the VCSEL.

The active region is further made up of one or more quantum wells sandwiched between two spacer cladding regions. Inside the spacers, the active region is sandwiched by confining layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells on GaAs substrates, longer wavelength VCSELs can be produced. The use of InGaAs quantum wells, however, causes strain in the quantum wells. If the quantum wells are grown past their critical thickness, they can relax by creating dislocations, and thus a poor quality active region results.

VCSELs made with GaAs and that emit light in the 850 nanometer range are known in the art. Because the quantum well for the short wavelength 850 nanometer VCSEls is made from GaAs (the same material as the substrate) the various epitaxially deposited layers, whose thickness is related to wavelength, are able to maintain the minimal mechanical strain without mechanical relaxation. If one were to use InGaAs in the active region at the larger 1.3 µm wavelength device range (e.g., 1200-1650 nm), however, the lattice mismatch is generally such that large layers would tend to relax their strains and suffer dislocations, produce slip lines or develop island growth, which would interfere with proper lasing.

In order to go to the proper bandgap for what is referred to in the art as a 1.3 µm wavelength (i.e. greater than 1200 nm) semiconductor laser, one generally uses InGaAs, GaAsSb or some combination thereof instead of GaAs in the active layer. Indium gallium arsenide (InGaAs) and gallium arsenide antimonide (GaAsSb), however, do not possess the same lattice constant as GaAs at the compositions useful for 1.3 micron lasers. This makes it very difficult to build a proper quantum well structure.

The thickness of the various layers in the active region while not arbitrary have some flexibility within the constraints of the design and the process. The combined thickness of the spacers, the confining layers, the barriers and the active regions sandwiched by the mirrors must be such that a Fabry-Perot resonator is formed. The quantum wells should generally be positioned so that they are roughly centered at an antinode of the optical electric field. These two requirements define the spacer thickness in terms of the other layer thicknesses.

The barrier layer thicknesses between the quantum wells need to be thick enough to adequately define the quantum wells, but thin enough that the quantum well positions are not excessively far from the antinode of the electric field. The thickness of the barrier layers at the boundaries of the quantum well regions has some flexibility. Optimally they need to be at least thick enough that the energy levels of each of the quantum wells are nominally the same. They can be thicker if material quality issues require this.

The confining layers are often one and the same with the spacers. Sometimes the confining layers and barrier layers are made from the same compositions, but this is not optimal for carrier confinement and is usually a compromise made for processing reasons.

The thickness of the quantum well is related by quantum mechanics to the well and barrier compositions, the desired emission wavelength, and the density of states. With a higher density of states, narrower quantum wells can be optimally used.

What is needed in the semiconductor laser, e.g., VCSEL, arts are devices that achieve long wavelength quantum wells normally fabricated on GaAs substrates. It is therefore very desirable to come up with a quantum well (i.e. the active layer and the barrier layers surrounding it) making use of materials such as GaAs, InGaAs or GaAsSb in construction of a VCSEL operational above the 1200 nm range.

BRIEF SUMMARY OF THE INVENTION

The following summary of the invention is provided to facilitate an understanding of some of the innovative features unique to the present invention, and is not intended to be a full description. Although reference is made to VCSEL, or vertical cavity surface emitting laser, devices throughout the text of this disclosure, it should be appreciated by those skilled in the art that aspects of the present invention can apply to semiconductor lasers in general where aspects of the present invention would be beneficial. The use of the term VCSEL herein should therefore not be taken as a limitation of the present invention. A full appreciation of the various aspects of the invention can be gained by taking the entire specification, claims, drawings, and abstract as a whole. Additional objects and advantages of the current invention will become apparent to one of ordinary skill in the art upon reading this disclosure.

Generally, the present invention describes methods and systems for producing semiconductor lasers exhibiting enhanced quantum well performance. Particularly, the present invention relates to systems and methods utilizing Migration Enhanced Epitaxy (MEE) during Molecular Beam Epitaxy (MBE) growth of quantum wells used in semiconductor lasing devices such as VCSELs.

In accordance with addressing the limitations of the prior art, presented are new and improved solid-state laser devices capable of exceeding 1200 nm in wavelength.

In accordance an embodiment of the present invention, a VCSEL can be provided wherein two-layer barrier layers comprised of GaAs and GaAsN, respectively, are provided adjacent at least one quantum well comprising GaAs and at least one of: N, In, and Sb.

In accordance with another embodiment of the present invention, a VCSEL can be provided wherein at least one three layer, GaAsN—GaAs—GaAsN barrier can be provided between and/or adjacent to at least one GaAs quantum well including at least one of: N, In and Sb.

In accordance with another embodiment of the present invention, a VCSEL can be provided including two-layer barrier layers comprised of GaAs and GaAsN, respectively, at least one GaAs quantum-based well including N, and at least one of Sb and In introduced in the at least one quantum well, and extended barrier layers comprised of GaAs bordering the active region between confinement layers comprised of Al.

In accordance with another embodiment of the present invention, a VCSEL can be provided wherein barrier layers comprised of at least two-layer including at least one of GaAsN and InGaAsN are provided between more than one quantum well including N, and at least one of In, Ga, As, Sb and P introduced in the more than one quantum well.

It is yet a feature of the present invention to include Migration Enhanced Epitaxy (MEE) into systems and methods used for fabricating VCSELs.

In accordance with another feature of the present invention, a VCSEL can be provided wherein InGaAs with N is introduced in quantum wells and at least one of GaAsN or GaAs into barrier layers using MEE.

In accordance with yet another feature of the present invention, a VCSEL can be provided wherein InGaAs with N is introduced in quantum wells and at least one of GaAsN or GaAs into barrier layers using MEE, wherein N is physically prevented from entering a wafer processing chamber during growth of layers without nitrogen.

In accordance with another feature of the present invention, hardware can be described wherein N is physically prevented from entering an MBE system chamber during barrier layer growth by incorporation of a gate valve on a Nitrogen source line between the Nitrogen source line and its physical entry into an MBE system housing.

In accordance with yet another feature of the present invention, a VCSEL can be provided including N within the active region and GaAs extended barrier layers bordering the nitrogen-containing active region and separating the nitrogen-containing active region from confinement layers including Al.

In accordance with yet another feature of the present invention, a VCSEL can be provided wherein InGaAs with N is introduced in the quantum well(s) and barrier layers and aluminum is added to the confining layers.

In accordance with yet another feature of the present invention, a VCSEL can be provided wherein InGaAs with N is introduced in the quantum well(s) and Al is introduced in the confining layers.

In accordance with yet another feature of the present invention, a VCSEL can be provided wherein an InGaAsSbN quantum well is provided with GaAsP barrier layers and AlGaAs confinement layers.

In accordance with yet another feature of the present invention, a VCSEL active region can be provided including InGaAsN quantum wells separated by barrier layers including at least one of: a two layer GaAsN—GaAs or three-layer GaAs—GaAsN—GaAs barrier; GaAs extended barrier layers disposed before and after the active region; and AlGaAs confining regions provided before and after the GaAs extended barrier layers opposite the active region, wherein the GaAs extended barrier layers prevent Al and N from combining between the active region and Al GaAs confining regions.

In accordance with another feature of the present invention, a VCSEL can be provided having an Indium-free GaAs structure with a GaAsNSb quantum well(s), GaAsN—GaAs barrier layers and AlGaAs confining layers.

In accordance with another feature of the present invention, a VCSEL active region can be provided having Indium-free GaAsSbN quantum well(s) GaAsN—GaAs—GaAsN barrier layers disposed before and after the quantum wells within the active region; GaAs outer barrier layers disposed before and after the active region; and AlGaAs confining regions disposed next to the outer barrier layers opposite the active region.

The present invention may be generally used, but specifically applies to GaAs substrates; InGaAs, InGaAsN, GaAsN, GaAsNSb, InGaAsSb and InGaAsSbN quantum wells; GaAs, GaAsN and GaAsP mechanical stabilizers, or any combinations thereof. In accordance with various additional aspects of the present invention, quantum wells and/or associated barrier layers can be grown with several novel and separately patentable combinations of nitrogen, aluminum, antimony, phosphorous and/or indium placed within or about a typical GaAs substrate to achieve long wavelength VCSEL performance, e.g., within the 1260 to 1650 nm range which is useful for fiber optic communication.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optoelectronic systems have not been described in particular detail in order to avoid unnecessarily obscuring the present invention.

Making long wavelength quantum wells on GaAs has proven to be very difficult according to conventional technology. One difficulty is that long wavelength compounds tend to not be lattice matched to GaAs. This has been alleviated recently using nitrogen in the quantum wells, which reduces the energy band and reduces the lattice constant in contrast to every other band gap reducing element. This allows the inclusion of other elements (e.g., In, Sb), and which reduces the band gap but increases the lattice constant. Unfortunately, the use of nitrogen can have the negative aspect of reducing confinement in the valence band and may tend to make poorer utility material as more nitrogen is added.

This invention can use strain compensation with or without nitrogen in the barrier layers to allow more indium and/or Sb incorporation in the quantum wells without relaxation and thus achieve longer wavelengths.

Figure 1:
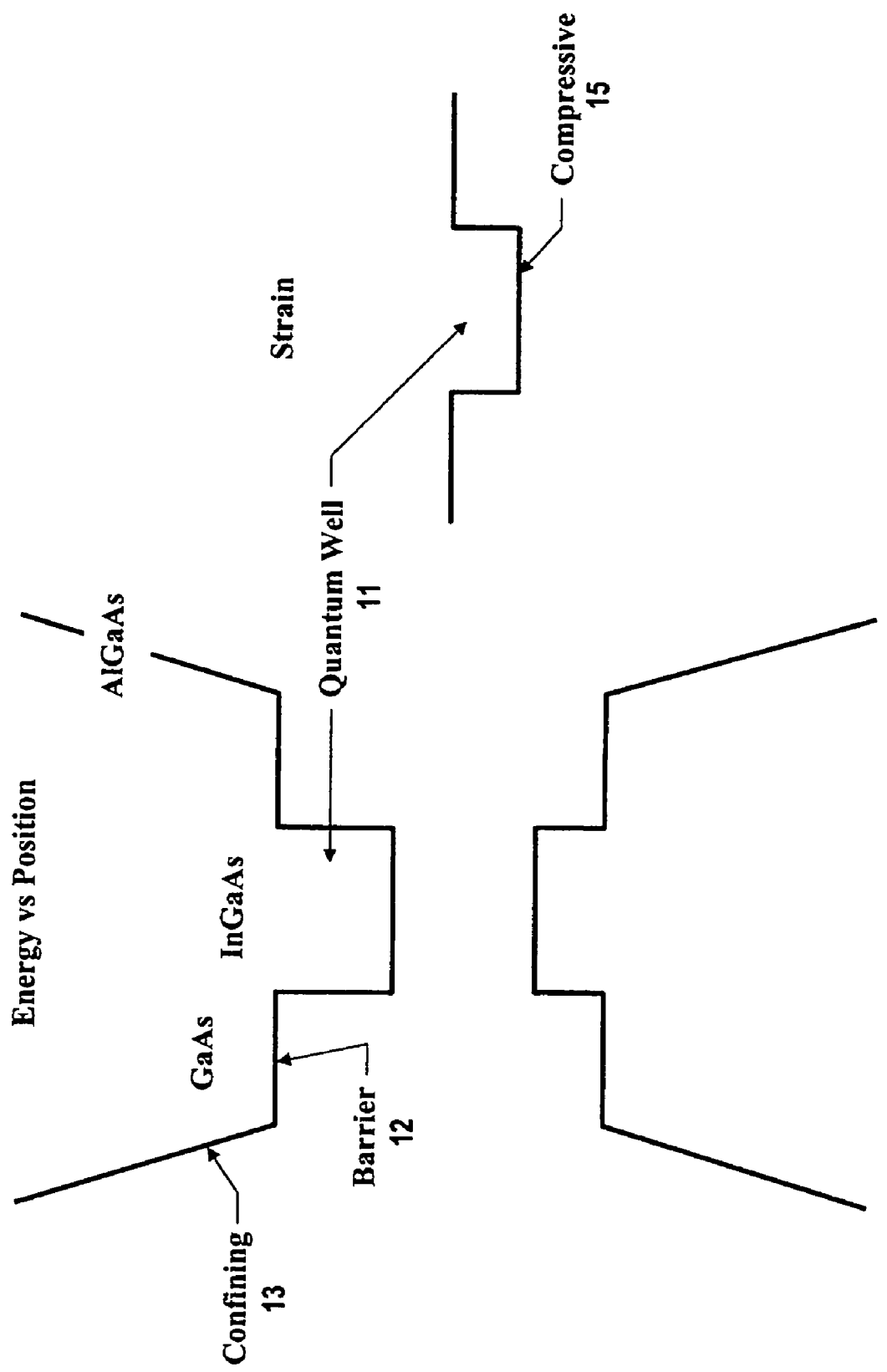
FIG. 1 is a graphical illustration of energy v. position and strain for a VCSEL having AlGaAs confinement areas, GaAs barrier layers and InGaAs quantum wells.

Before addressing in greater details aspects of the invention, a preliminary description in conjunction with FIGS. 1-11 is provided. Referring to FIG. 1, portions of the illustrations in FIG. 1-11 on the left hand-side of the drawings are meant to graphically represent the position of a quantum well 11, barrier layers 12, and confinement layers 13 of a VCSEL. Power is represented in the Figures with lines drawn vertically with respect to the position of the components mentioned. On the right hand of FIGS. 1-11, strain for each illustrated device is also shown graphically, with compression also being represented vertically downwards and tension represented vertically upwards.

Referring to FIG. 1, a graphical illustration of "energy v. position" and "strain" for a VCSEL having AlGaAs confinement layers 13, GaAs barrier layers 12 and an InGaAs quantum well 11 is shown and will serve as a benchmark for adjustments made in FIGS. 2-11. With use of an InGaAs quantum well on a GaAs substrate, longer wavelengths can be achieved, however, strain is also caused in the quantum well as shown by the depth 15 of the associated strain measurement.

Figure 2:
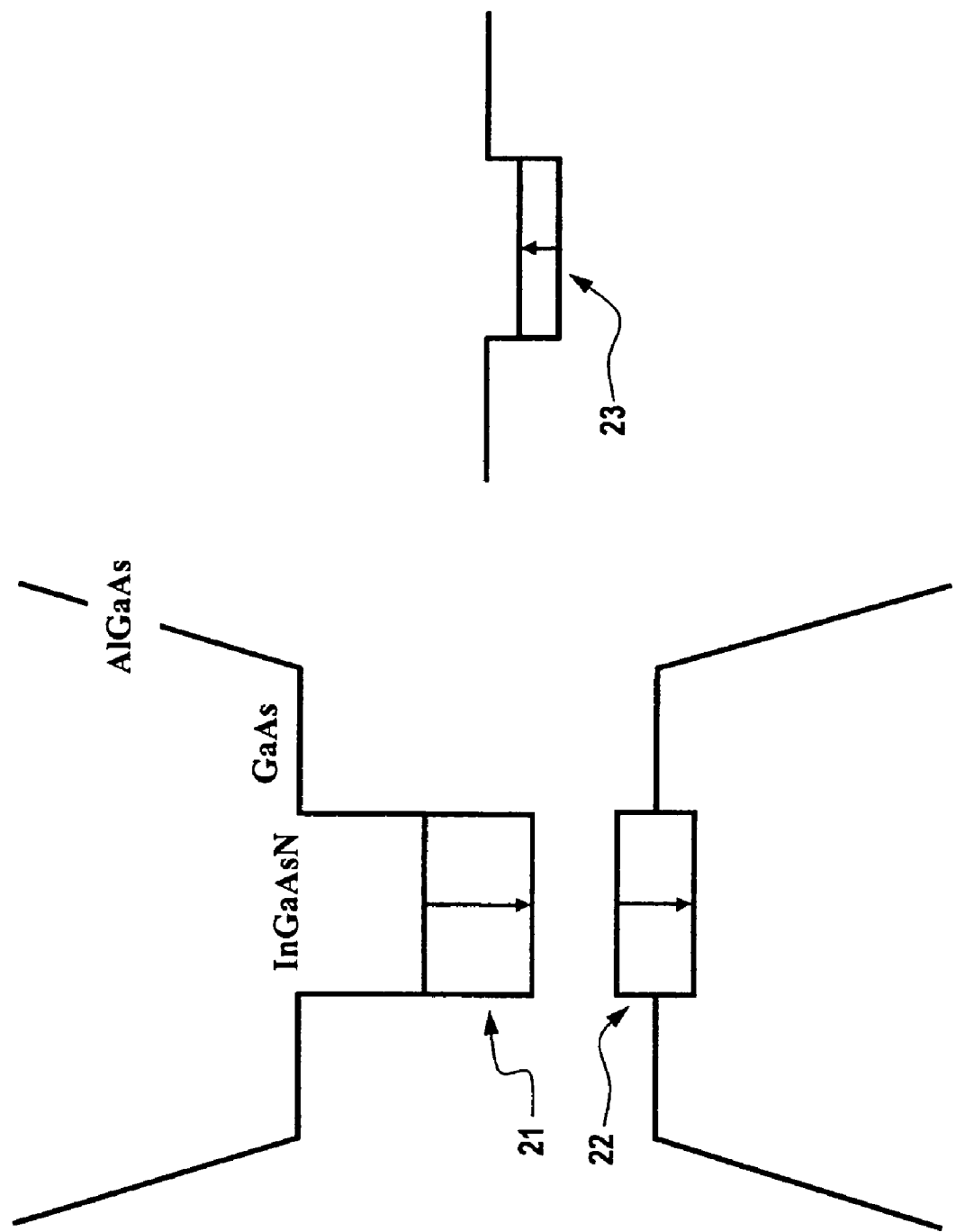
FIG. 2 is a graphical illustration of "energy v. position" and "strain" for a VCSEL having AlGaAs confinement layers, GaAs barrier layers and InGaAsN quantum wells.

Referring to FIG. 2, a VCSEL is shown having AlGaAs confinement layers, GaAs barrier layers and an InGaAsN quantum well. Nitrogen is added to the InGaAs quantum well of FIG. 1, which resulted in a decrease in energy 21 and valence 22 band confinement. Here in FIG. 2, however, strain was reduced 23 when compared to the nitrogen-free device of FIG. 1.

Figure 3:
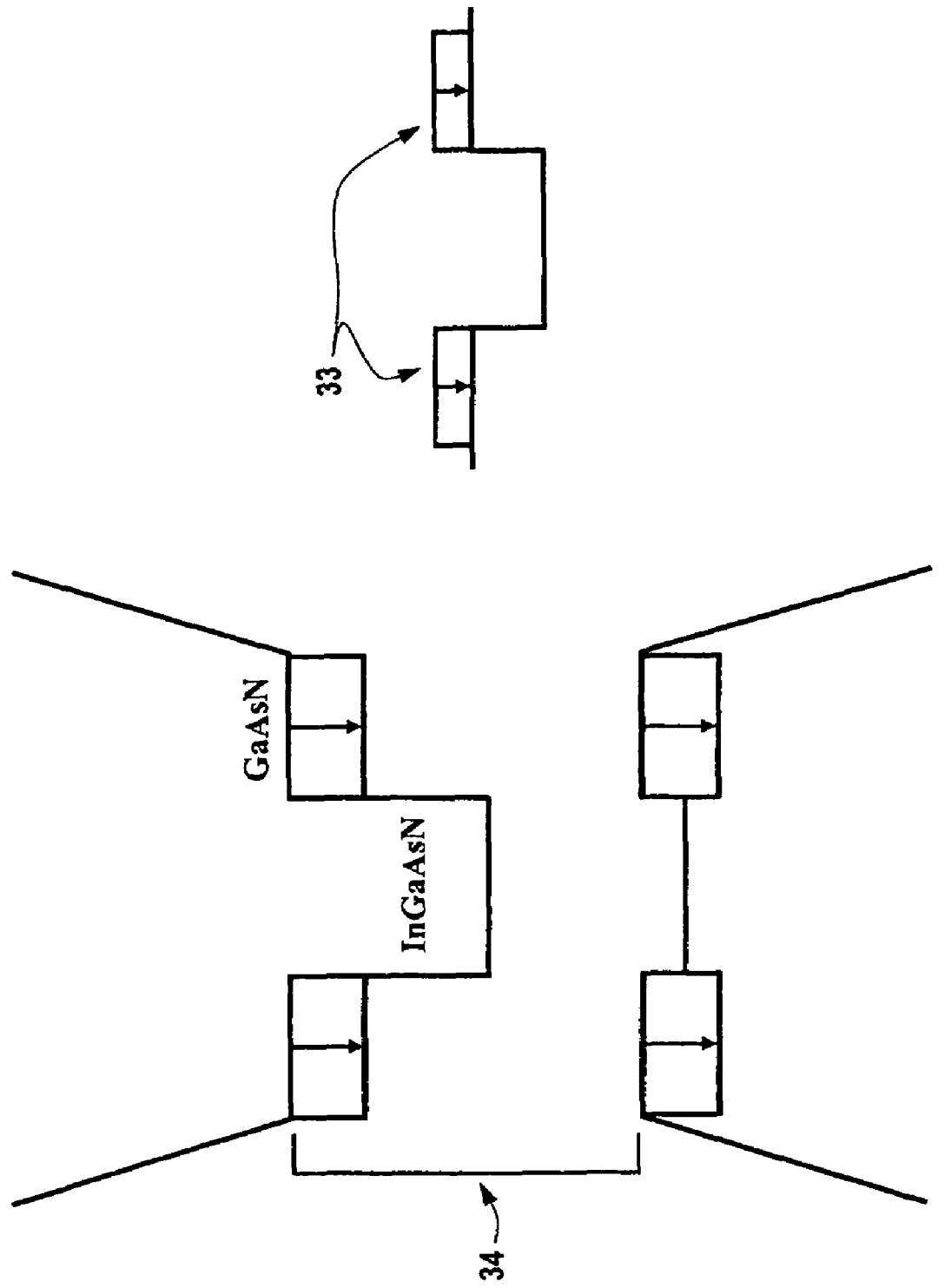
FIG. 3 is a graphical illustration of "energy v. position" and "strain" for a VCSEL having GaAsN barrier layers and InGaAsN quantum wells.

Referring to FIG. 3, nitrogen (N) is also added to the barrier layers of the device shown in FIG. 2. As shown by the arrows 34 in FIG. 3, the hole well is recreated with the introduction of nitrogen in the barrier layers. In addition, strain compensation 33 was provided to the device with the addition of nitrogen to the barrier layers. It should be noted that strain compensation would be realized even where nitrogen is not also introduced in the quantum well.

Figure 4:
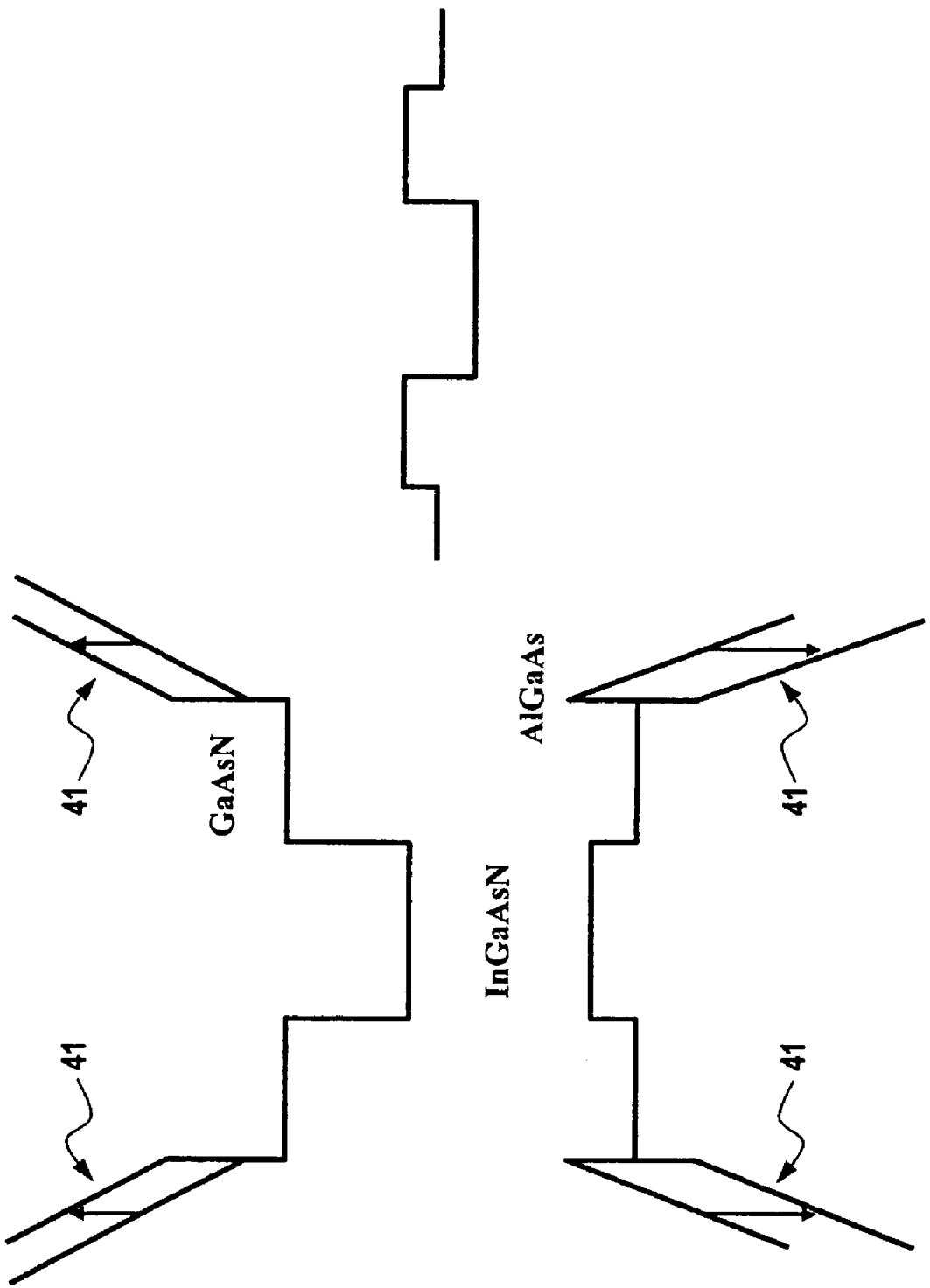
FIG. 4 is a graphical illustration of "energy v. position" and "strain" for a VCSEL having AlGaAs confinement layers, GaAsN barrier layers and InGaAsN quantum wells.

Referring to FIG. 4, Aluminum (Al) is now added to the confinement layers/areas of the device shown in FIG. 3. Providing Al to the confinement layers eliminates or substantially reduces undesirable wells at the edges of the device as shown by the arrows 41 in the Figure. The introduction of aluminum, however, has a negligible effect on the strain of the devices strain.

Figure 5:
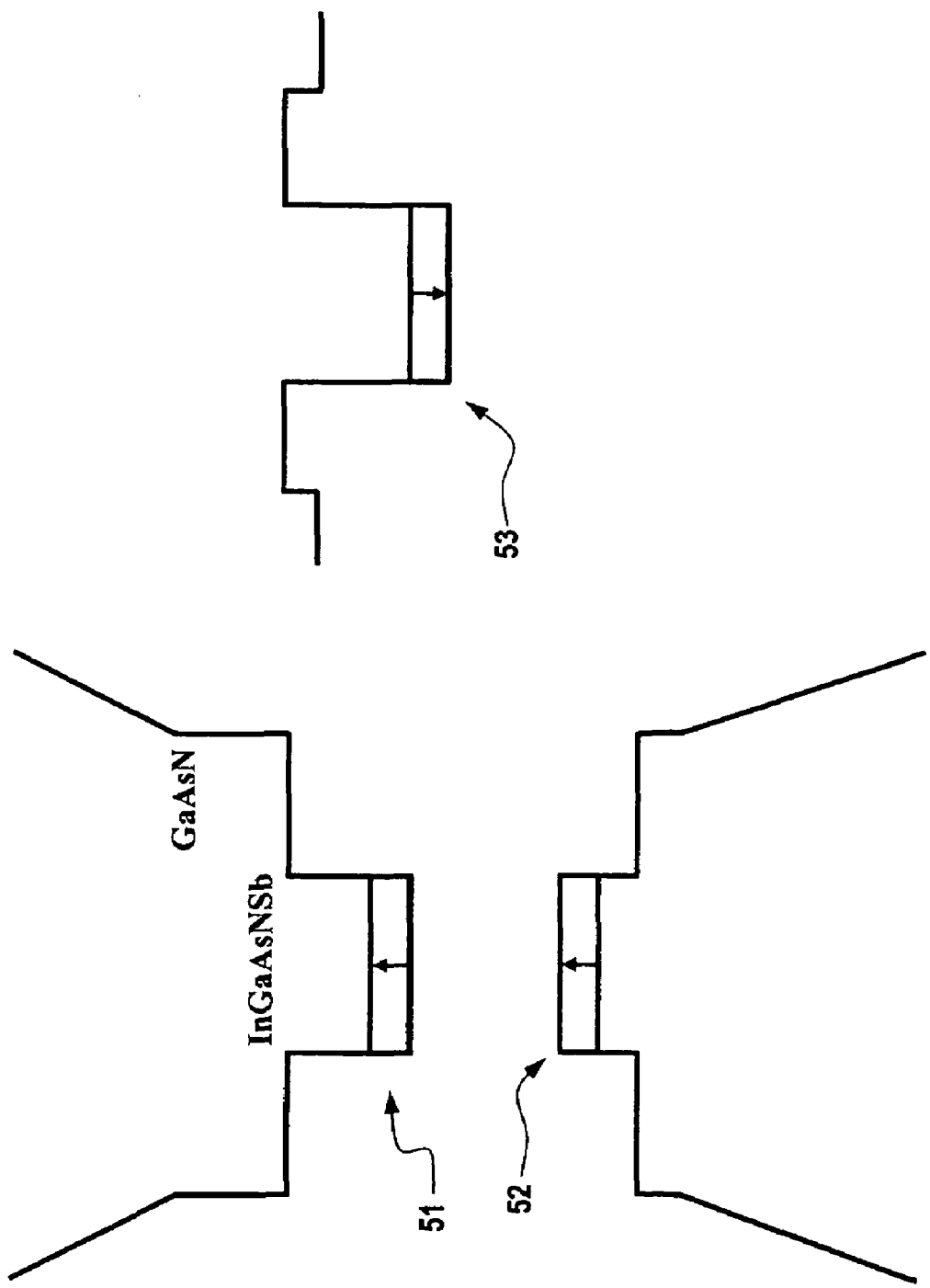
FIG. 5 is a graphical illustration of "energy v. position" and "strain" for a VCSEL having GaAsN barrier layers and InGaAsNSb quantum wells.

Referring to FIG. 5, antimony (Sb) is now added to the quantum well of the device previously viewed in FIG. 4. The introduction of Sb to the quantum well causes a decrease in the band gap, an increase 52 the valence band well, and a decrease 51 the conduction band well. Strain in the device is increased with the introduction of Sb.

Figure 6:
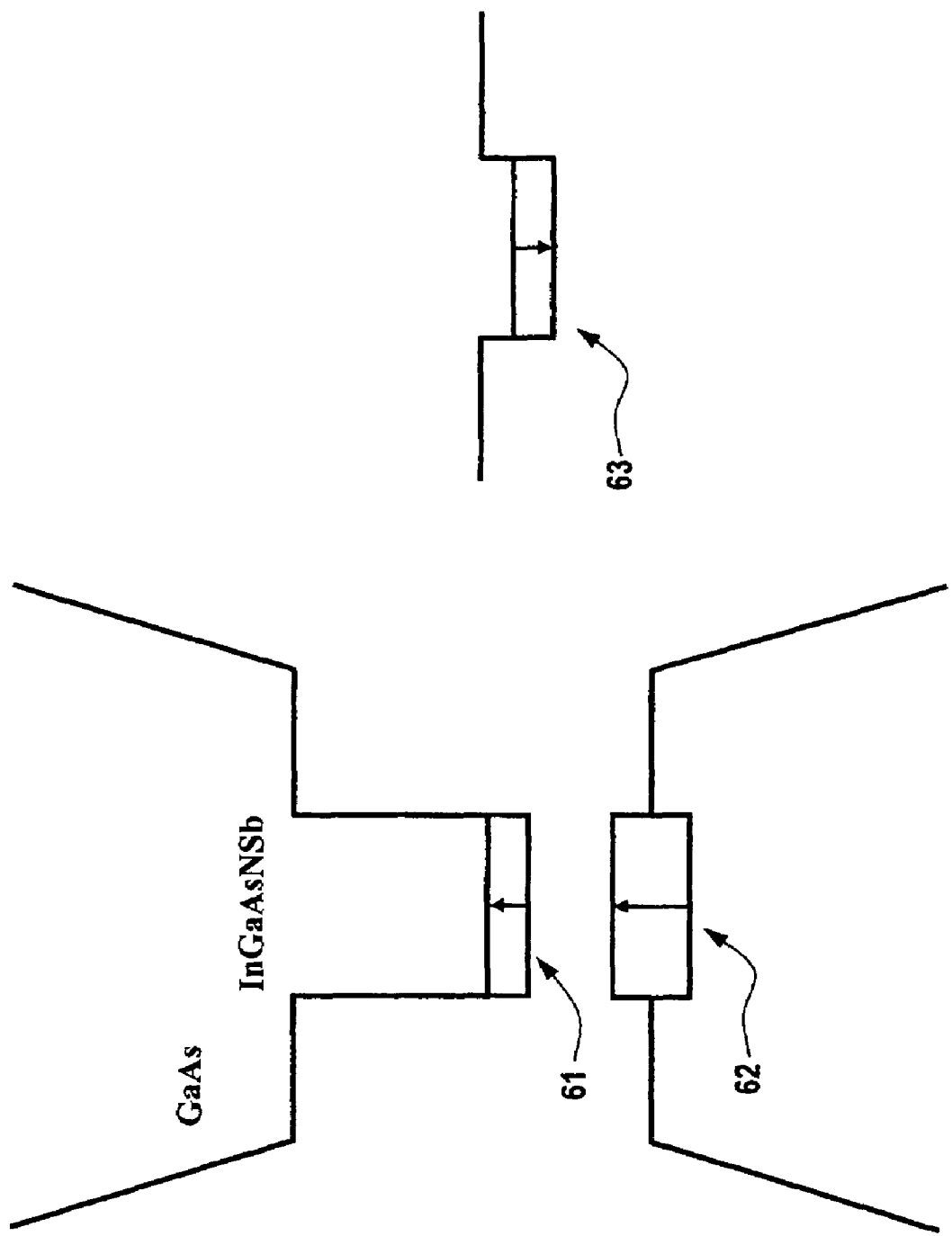
FIG. 6 is a graphical illustration of "energy v. position" and "strain" for a VCSEL having GaAs barrier layers and GaInAsNSb quantum wells.

Referring to FIG. 6, Sb was added to the quantum well for the device illustrated in FIG. 2. The band gap for the device increases the valence band well 61, but decreases the conduction band well 62. Compressive strain in the quantum well is also shown to increase with Sb.

Figure 7:
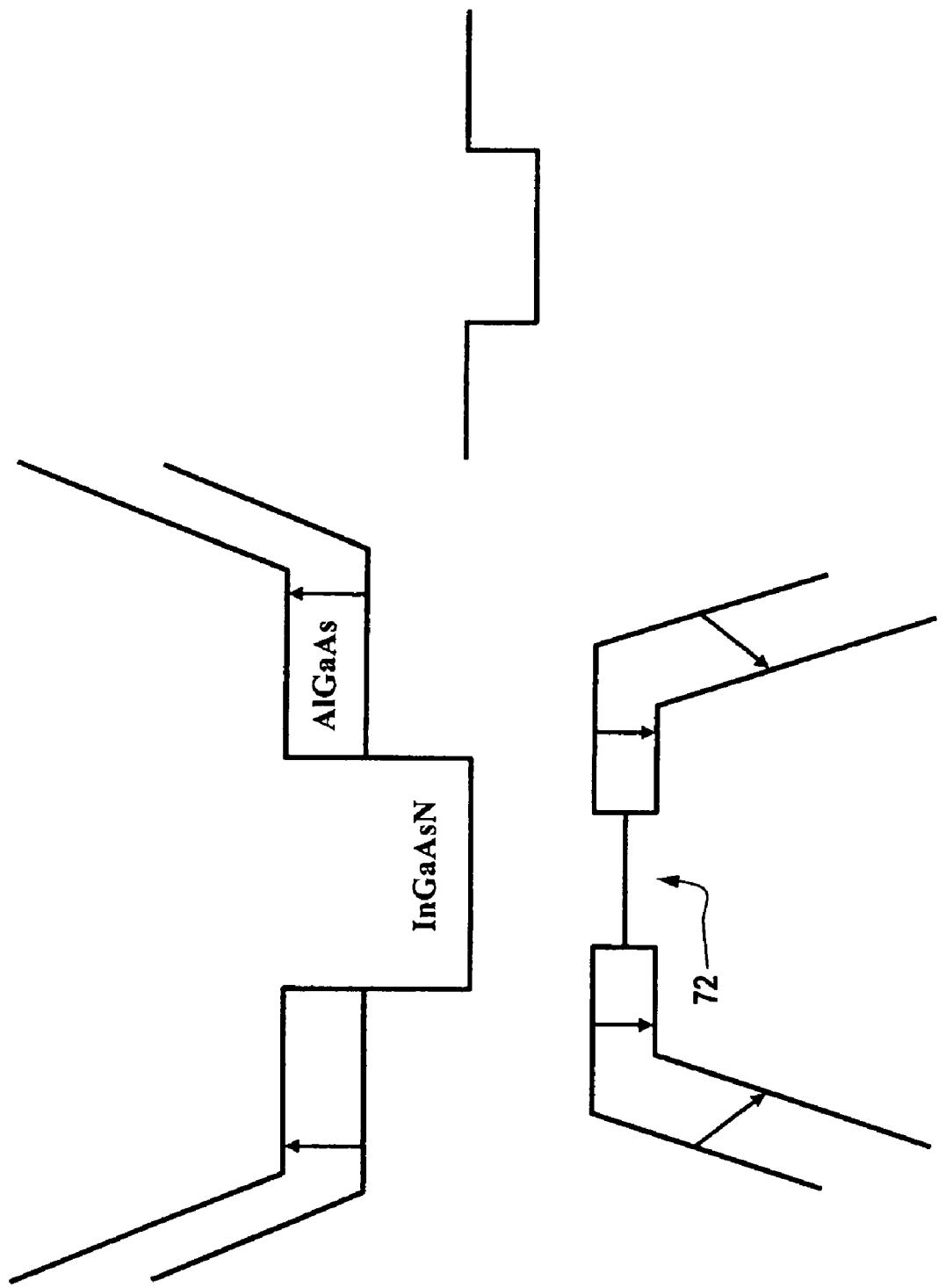
FIG. 7 is a graphical illustration of "energy v. position" and "strain" for a VCSEL having AlGaAs barrier layers and InGaAsN quantum wells.

Referring to FIG. 7, aluminum (Al) is added to the barrier and confining layers of the device first shown in FIG. 2. As seen in the graphical illustration, the valence band well is recreated 72 using Al. Strain compensation is unremarkable from its initial position in FIG. 2.

Figure 8:
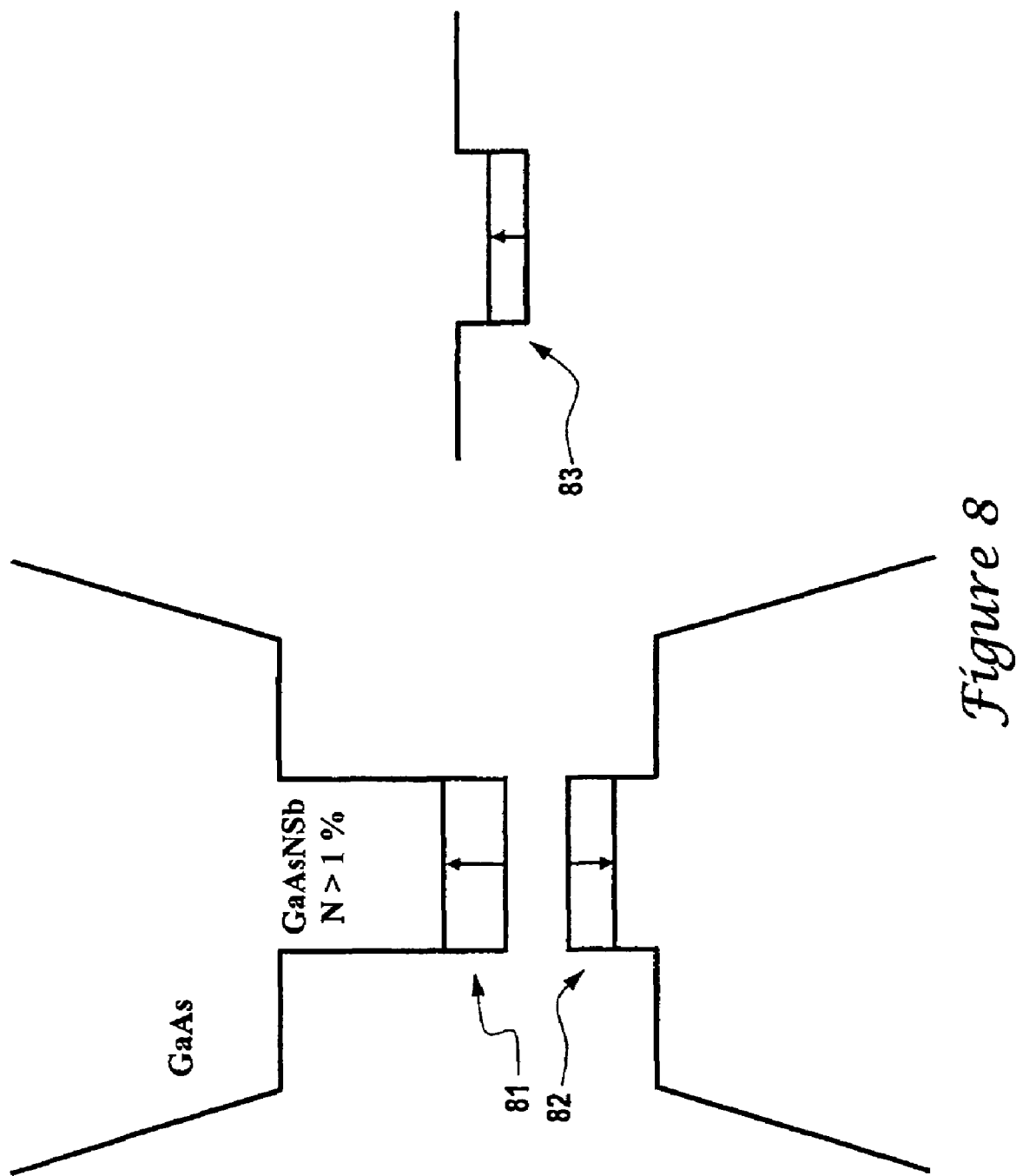
FIG. 8 is a graphical illustration of "energy v. position" and "strain" for a VCSEL having GaAs barrier layers and GaAsNSb quantum wells with >1% nitrogen.

Referring to FIG. 8, an Indium free device is shown. Indium is removed from the device shown graphed in FIG. 6. The quantum well includes GaAsNSb. The band gap decreases 82 for the valence band well and decreases 81 in the conduction band well. Device strain 83 is shown to improve with the removal of In.

Figure 9:
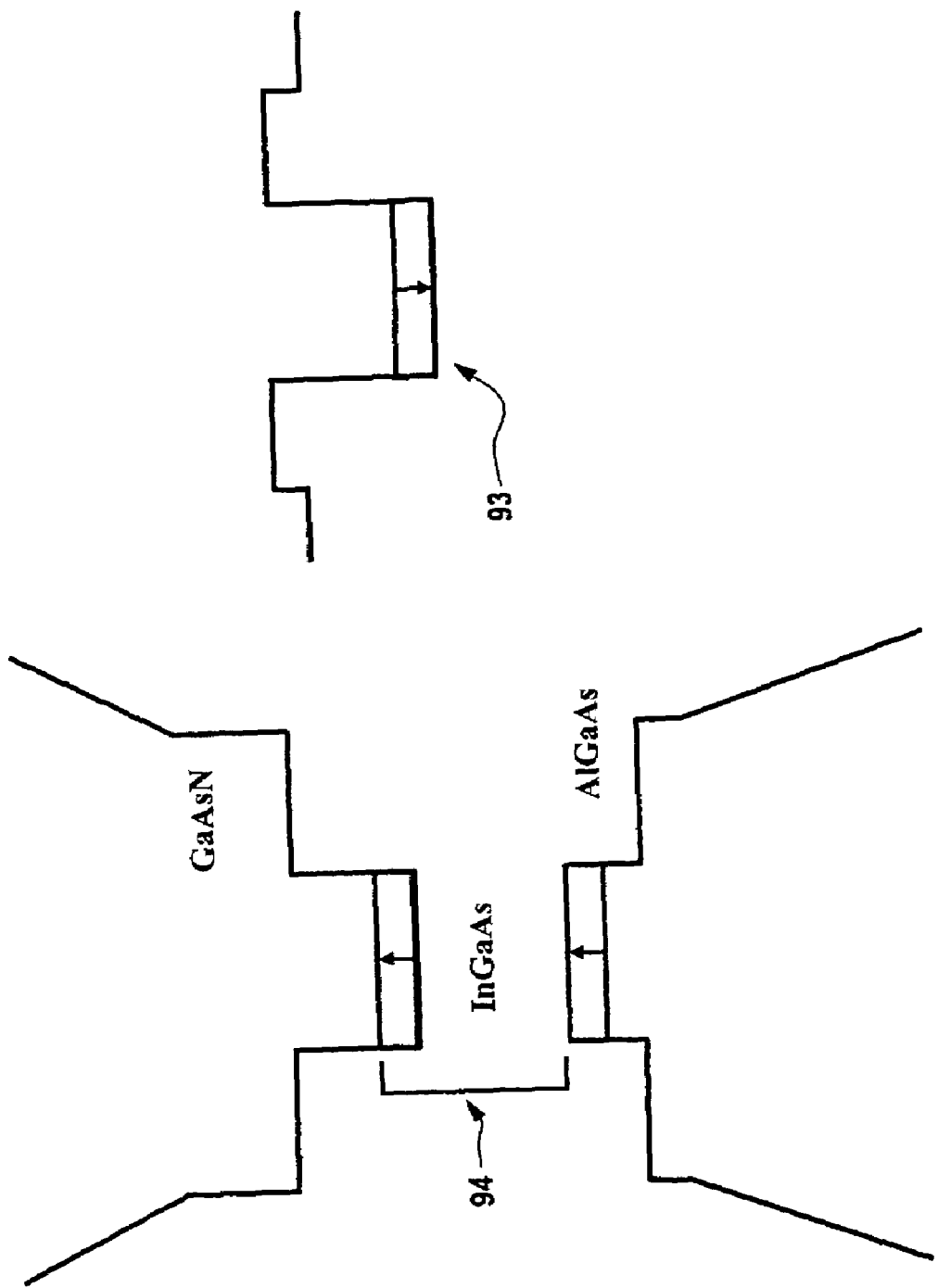
FIG. 9 is a graphical illustration of "energy v. position" and "strain" for a VCSEL having AlGaAs confinement layers, GaAsN barrier layers and InGaAs quantum wells.

Referring to FIG. 9, nitrogen is shown removed from the quantum well for the device shown in FIG. 4. The removal of N from the quantum well increases 94 band gap and hole confinement. Strain, however, is also increased 93 in the quantum well, but is compensated for in the barrier region.

Figure 10:
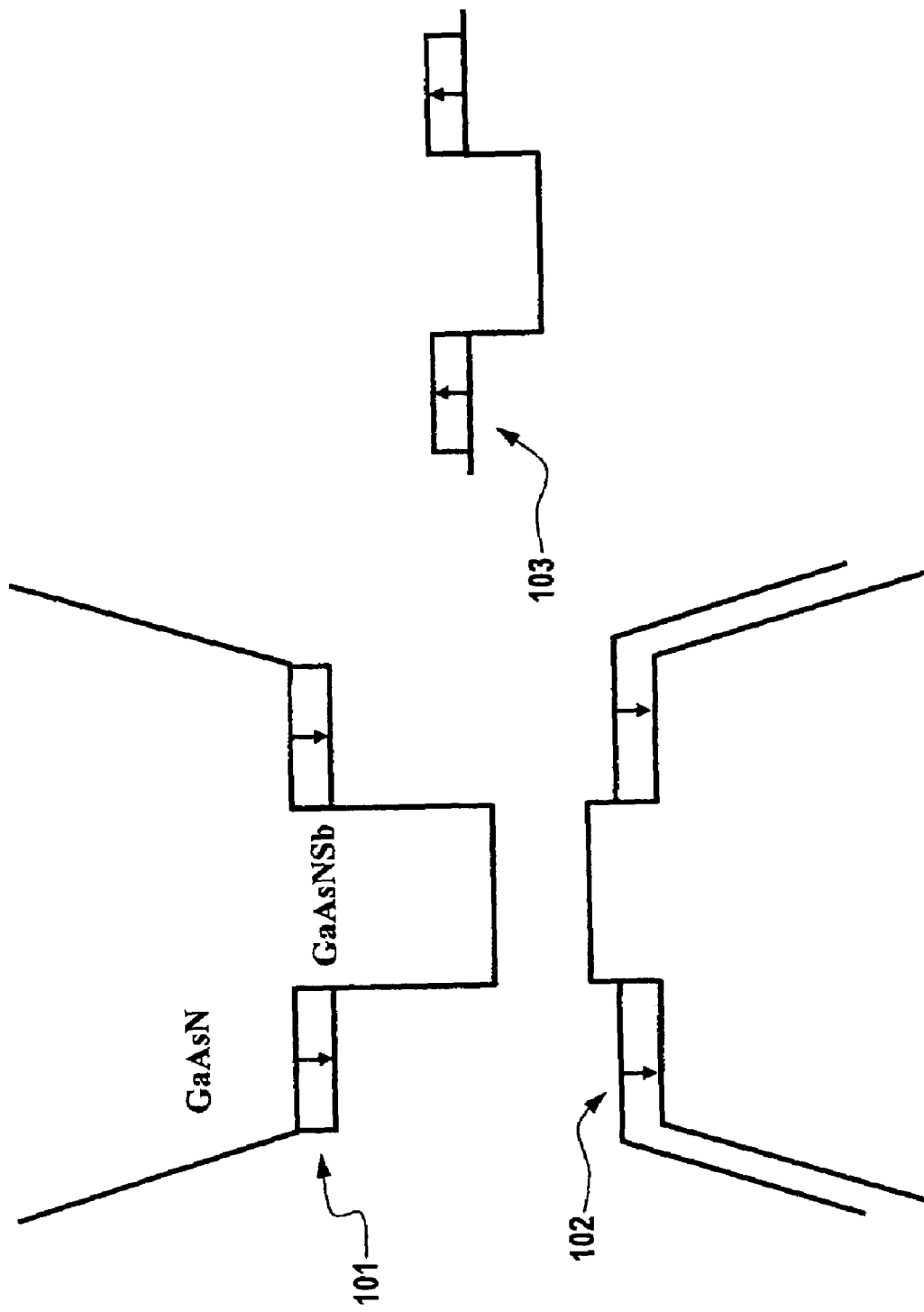
FIG. 10 is a graphical illustration of "energy v. position" and "strain" for a VCSEL having GaAsN barrier layers and GaAsNSb quantum wells.

Referring to FIG. 10, a strain compensated device is illustrated. The device of FIG. 8 is improved by adding nitrogen to the barrier layers and aluminum to the confining layers. The quantum well comprises GaAsSbN. This combination increases 102 the hole well and decreases 101 the electron well. The overall strain in the device is reduced 103.

Figure 11:
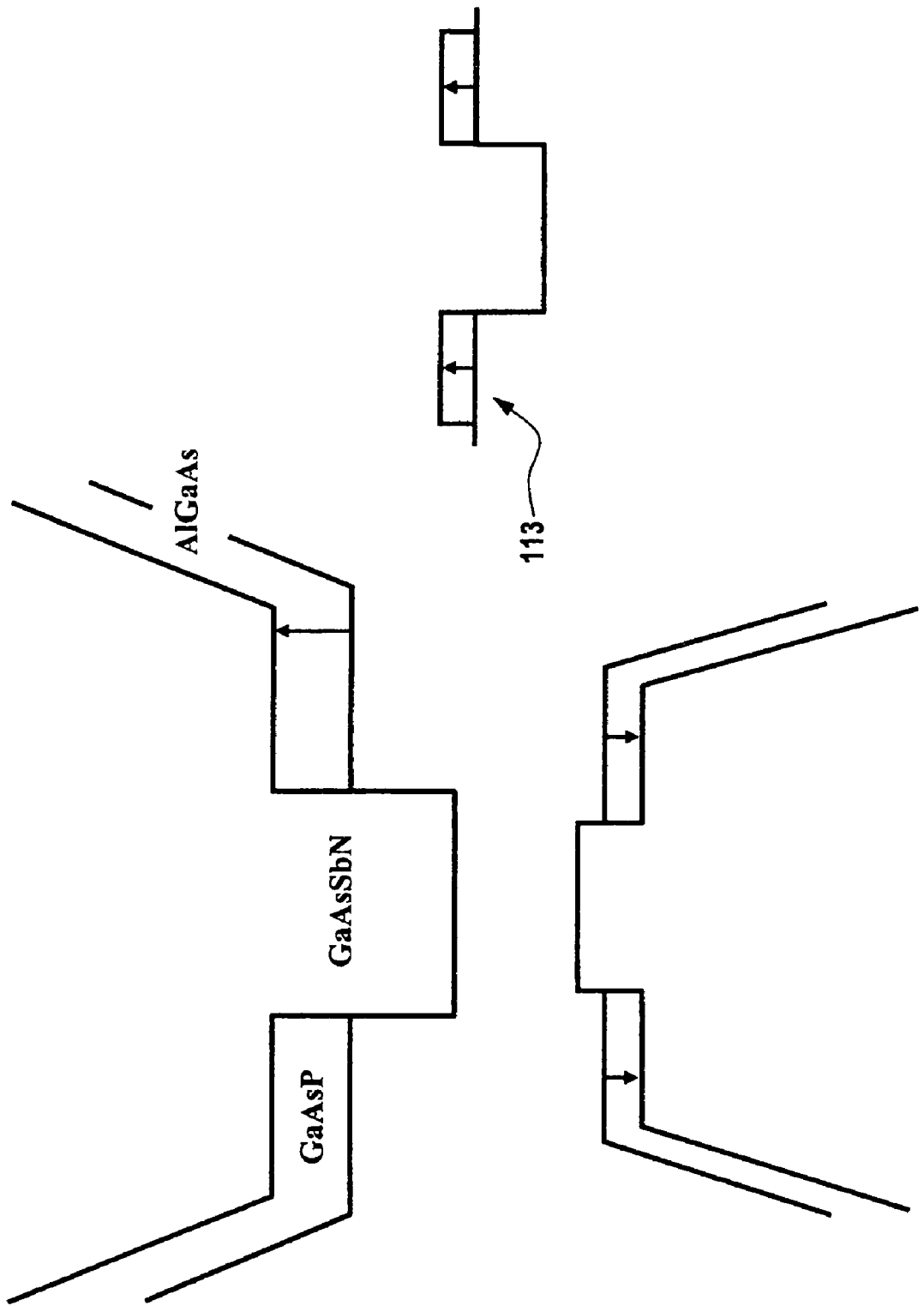
FIG. 11 is a graphical illustration of "energy v. position" and "strain" for a VCSEL having AlGaAs confinement layers, GaAsP barrier layers and GaAsSbN quantum wells.

Referring to FIG. 11, additional strain compensation is shown 113 by adding phosphorous (P) to the barrier layers. The device in FIG. 11 is shown to have AlGaAs confinement layers and a GaAsSbN quantum well. Indium can also be used in the quantum well.

By normal means it is impossible to reach 1310 nm quantum wells used in datacom VCSELs and edge emitters. Referring to FIG. 1, what is illustrated is a typical InGaAs strained quantum well on GaAs. By further using nitrogen for strain compensation in the barriers (as shown in FIGS. 3, 9), enough indium can be added to the quantum wells without relaxation to reach 1310 nm, and because little or no nitrogen is used in the quantum well itself hole confinement and material quality are maintained. Using AlGaAs confining layers with sufficient Al to avoid extra wells being formed can be advantageous; however, the pairing of aluminum and nitrogen can produce deep traps within the device, which enhances non-radiative recombinations. Therefore, Al and N should not be allowed to pair or overlap during device processing.

As mentioned above, FIG. 8 shows a GaAsSbN quantum well with GaAs barriers. In this case, both Sb and nitrogen lower the band gap. The Sb causes the quantum well to tend towards poor electron confinement with good hole confinement, and the nitrogen tends to go in the opposite direction towards poor hole confinement and good electron confinement. By adjusting the ratio of the at least 0.07 eV well depth in the conduction band, the 0.05 eV depth in the valence band can be achieved while achieving both 1310 nm and 1550 nm light emission.

If large quantities of Sb and little N are used in the quantum wells such that there is excessive compressive strain in the quantum wells, invention aspect 1 can be combined with this to compensate the excessive compressive strain. That is nitrogen or phosphorous can be added to the barriers layers because it tends to deepen the electron well which the Sb in the quantum well tends to shallow the electron well. It is also useful to increase the gap of the confining layers with Al or even P once again to avoid extra wells.

Indium can be used in the quantum well of invention to adjust the wavelength, well depths and strain in the quantum wells. As the band gap shrinks, the wells become more compressive. But adding indium has only a secondary effect on the relative band offsets (valence band or conduction band) as shown in FIGS. 5 and 6. FIG. 6 will work for both 1310 nm and 1550 nm active regions.

As shown in FIG. 7, AlGaAs barrier layers can be used for InGaAsN quantum wells to increase the hole well depth. Because nitrogen increases the electron effective mass the quantum wells containing nitrogen can be made thinner, that is less than 50 Å. In VCSELs, this means there are more quantum wells.

All aspects of the present invention can apply to single as well as multiple quantum wells in both edge emitters and VCSELs and other semiconductor lasers. In all of the above, at least a 0.07 eV well depth is maintainable in the conduction band, and a 0.05 eV depth is maintainable in the valence band.

Epitaxy flattening techniques, which reduce the bunching of steps, can be used in combination with the above. Intra-quantum well mechanical stabilizers can also be used with the above.

Figure 12:
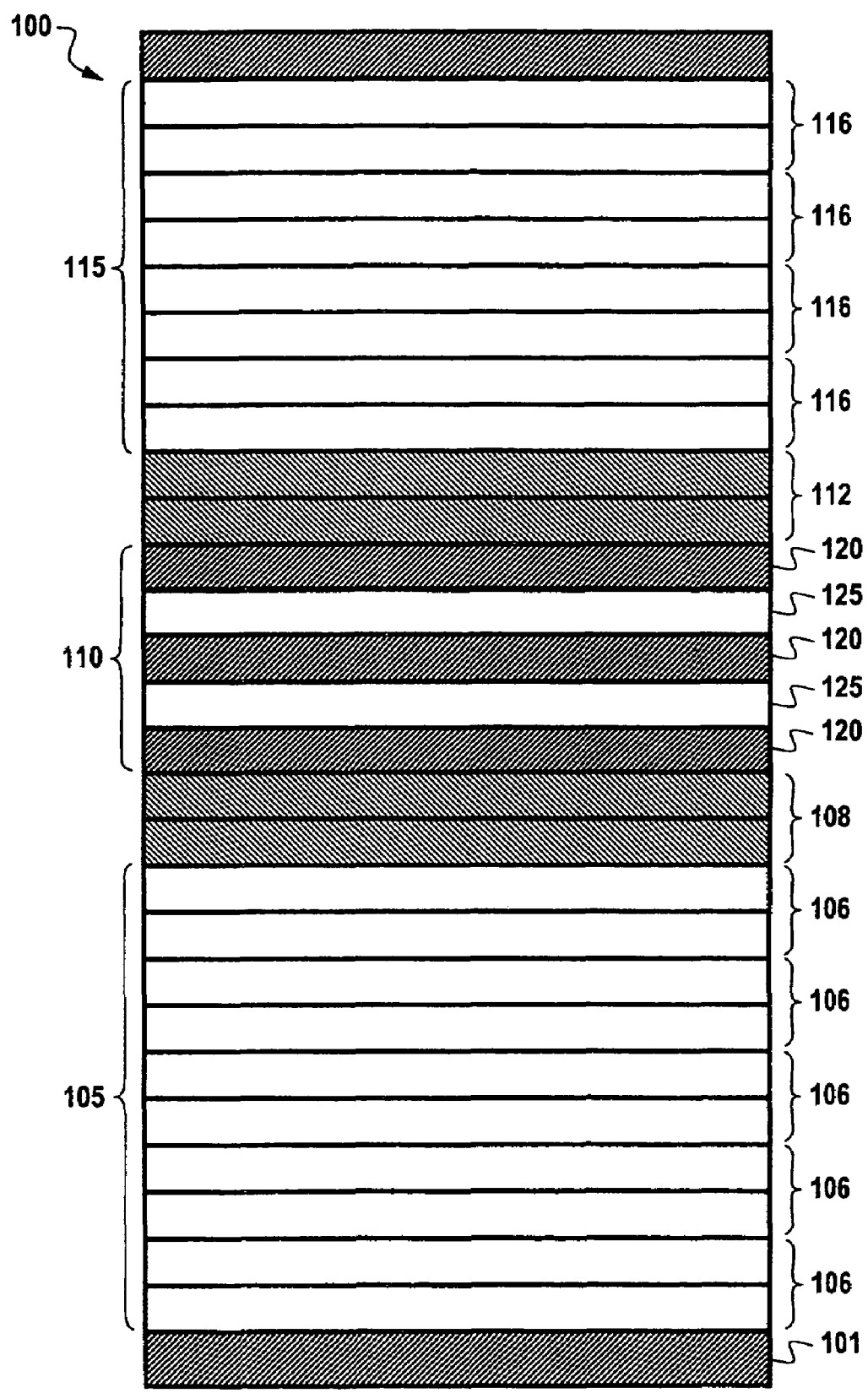
FIG. 12 is an exemplary sectional view of a VCSEL in accordance with an embodiment of the present invention.

Referring to FIG. 12, illustrated is a sectional view of a VCSEL 100. A VCSEL 100 can be grown by techniques such as metal organic molecular beam epitaxy, or metal-organic chemical vapor deposition. Further details regarding methods for fabricating VCSELS are provided in U.S. Pat. No. 5,903,589, incorporated herein by reference in its entirety. The VCSEL 100 can preferably be grown on a GaAs substrate 101 due to the robust nature and low cost of the material, however it should be recognized that semiconductor materials, Ge, for example, could also be used as the substrate. The VCSEL 100 can then be formed by disposing layers on the substrate.

Epitaxial layers can include: a first mirror stack 105 disposed on the substrate 101, a first cladding region 108 disposed on the first mirror stack 105, an active region 110 disposed on the first cladding region 108, a second cladding region 112 disposed on the active region 110, and a second mirror stack 115 disposed on the second cladding region 112. The active region 110 can further include one or more quantum wells 120 being separated from each other by barrier layers 125, depending on the application for which the VCSEL 100 is designed. One of ordinary skill in the art will find it obvious to differ the number of quantum wells 120 in the VCSEL active region 110.

The first mirror stack 105 can be grown by epitaxially depositing mirror pair layers 106 on the substrate 101. In order to crystal lattice match mirror stack 105 to the substrate 101, a suitable semiconductor material system for the mirrored pairs 106 should be deposited. In this specific example, which should not be taken as a limitation of the full scope of the present invention, the substrate 101 is GaAs, therefore a GaAs/AlGaAs material system can be employed. To achieve a high percentage of reflectivity, the number of mirror pair layers 106 in the stack 105 can usually range from 20 to 40, depending on the difference between the refractive indices of the layers. Different refractive indexes are also achievable by altering the Aluminum content in the mirror stack 105.

A first cladding region 108 can be made of one or more layers epitaxially disposed on the first mirror stack 105. The first cladding region 108 in the currently described embodiment of the invention can be made of a GaAsN material system.

It has been shown that Nitrogen added to the quantum well 120 can have the effect of increasing the strain between the layers, which reduces the band gap energy of the excited state. Band gap energy reduction generally decreases the amount of energy required to excite the material, and increases the wavelength of the emitted photon. This can be desirable to achieve longer wavelength VCSELs 100. The more Nitrogen that is added to the quantum well 120, the greater this reduction in band gap energy can be, and thus longer wavelength VCSELs 100 can be produced.

As discussed above, by using nitrogen in the GaAsN barrier layers and secondarily in the quantum wells themselves, the strain in the structure can be reduced, which can increase the allowable thickness of the quantum wells, and the energy gap can be reduced, both capable of increasing the allowable wavelength.

The use of nitrogen in the quantum wells can make the valence band discontinuity non-confining or type II. By using AlGaAs or AlGaAsN as the confining material, however, and GaAsN, AlGaAs, or AlGaAsN or GaAsP barrier layers, the non-confining problem can also be reduced. In addition, if Sb replaces a portion of the As in the quantum well, the type II transition caused by nitrogen can further be avoided allowing even more nitrogen. Because even more nitrogen is allowable, more indium is also allowable. Because nitrogen, indium, and antimony all reduce the band gap energy, the achievable wavelengths extend to wavelengths longer than either 1310 mm used for data communications or 1550 nm used for telecommunications.

By adding Nitrogen to the InGaAs quantum wells, the overall strain in the well can become significantly less allowing more indium before reaching the critical thickness, thus making longer wavelength VCSELs possible. Using nitrogen for strain compensation in the barriers, the allowable strain in the quantum well region can increase, meaning even more indium can be used in the quantum wells. More indium is generally allowable without violating the critical thickness, making for an even lower band gap and longer wavelengths. In addition, using nitrogen in the barrier layers between the quantum wells can also reduce the energy of these barriers in the conduction band making the energy of the quantum state lower, further increasing the allowable wavelength. Using nitrogen in the barrier layers can also be advantageous in avoiding type II behavior in the valence band because as nitrogen is incorporated in the quantum wells, the conduction band discontinuity increases, and the valence band discontinuity decreases. In addition, use of AlGaAs or AlGaAsN for the confining structure can further avoid unintentional wells in the valence band at the barrier layer confining layer boundary. Finally, the use of Sb in the quantum well can reduce the band gap energy further, while avoiding the type II behavior (allowing even more nitrogen). All of these aspects contribute to the ability to create very long wavelength active regions.

Introducing Nitrogen into the active region 110 is not generally without drawbacks. GaN and InN can have large differences in their lattice constants as well as optimal growth conditions. Due to this lattice mismatch, the quality of the material can be greatly compromised when layers comprising the active region 110 are grown beyond a certain critical thickness. Layers thicker than this critical thickness can have misfit dislocations, relaxing the strain between the layers, and decreasing the material quality. This can substantially compromise the quality of the VCSEL 100.

By including Nitrogen in the barrier layers 125, the band gap energy decrease can be observed as it is when Nitrogen is added only to the active region 110. However, the amount of Nitrogen, which is utilized in the active region 110 to achieve a given band gap energy reduction, and therefore a longer wavelength, can be reduced. The lattice mismatch can therefore not generally be as severe as when Nitrogen is added to the active region 110 alone, thus making the material system easier to fabricate. Higher quality VCSELs can be achieved by introducing Nitrogen into the barrier layers 125 than when Nitrogen is only added to the active region 110.

Active region 110 can next be epitaxially deposited on the first cladding region 108. The active region 110 can include one or more quantum wells 120. The preferred embodiment uses quantum wells 120 of less than 50 angstroms. When Nitrogen is introduced into the active region 110 or the cladding region 108 or 112, the effective electron mass in the regions can increase dramatically. With this increased density of the states, the amount of Indium or Nitrogen needed to produce a given amount of gain in the active region 110 generally decreases. Therefore, the volume of the quantum well 120 can also be decreased, giving less volume for parasitics to occur in.

A second cladding region 112 can be made of one or more layers epitaxially disposed on the active region 110. The second cladding region 112 can be made of a GaAsN material system.

A second mirror stack 115 can next be grown by epitaxially depositing mirror pairs layers 116 on the second cladding region 115. In order to crystal lattice match mirror stack 115 to the substrate 101, a suitable semiconductor material system for the mirrored pairs 116 should be deposited. The substrate 101 is formed of GaAs; therefore a GaAs/AlGaAs material system can be employed. To achieve a high percentage of reflectivity, the number of mirror pair layers 116 in the stack 115 can usually range from 20 to 40, depending on the difference between the refractive indices of the layers. Different refractive indexes are achievable by altering the Aluminum content in the mirror stack 115.

Figure 13:
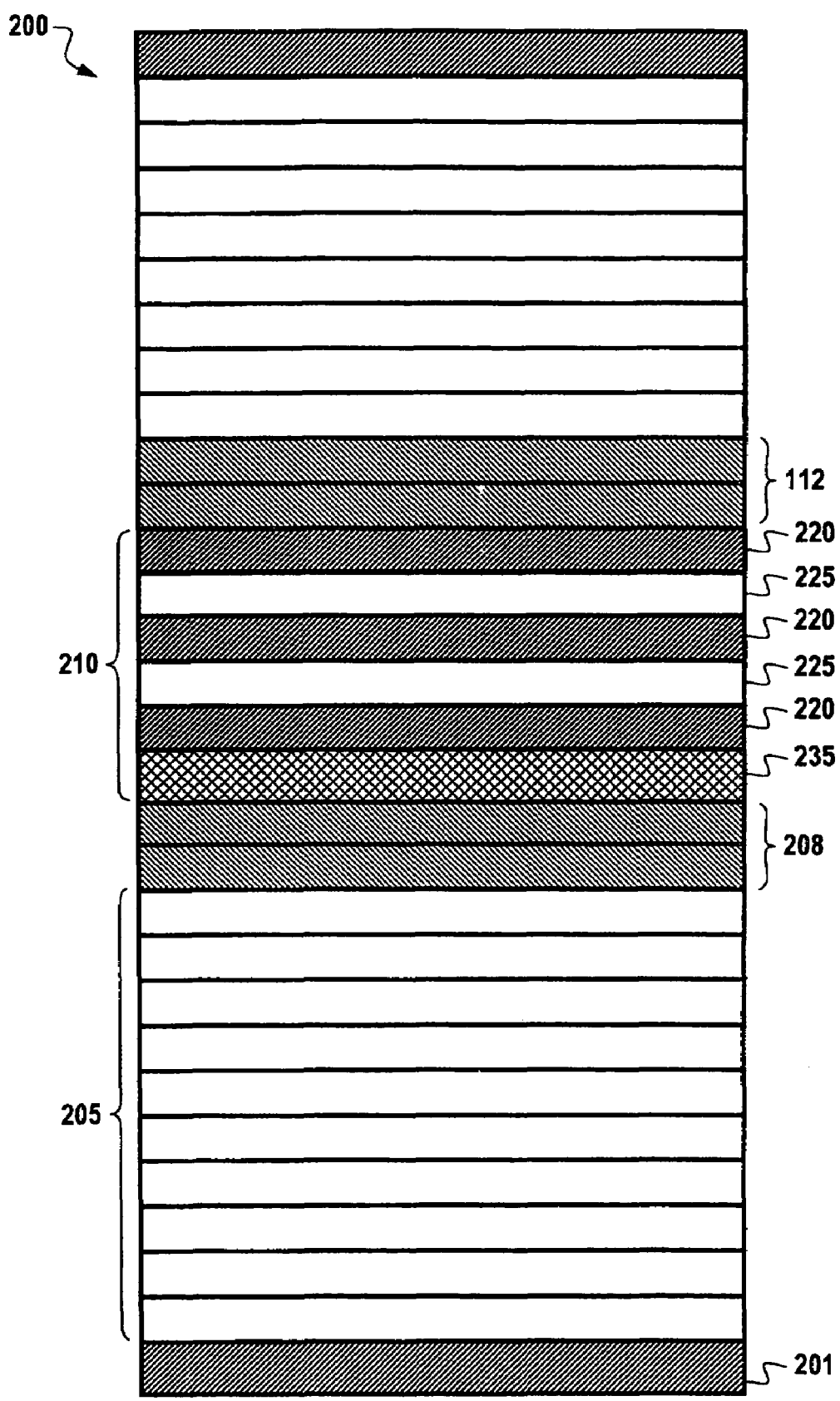
FIG. 13 is another exemplary sectional view of a VCSEL in accordance with another embodiment of the present invention.

Referring now to FIG. 13, an alternate embodiment of the present invention is shown. A flattening layer 235 can be sandwiched between the lower confining layer 208 and the quantum wells 220 and barrier layers 225. When the various layers are grown on the substrate, bunching of molecular steps form on the surface of the newly formed layers. The steps on the layer's surface increase the likelihood that layers adjacent to the substrate 201 can dislocate from the substrate 201. A heavily compressively strained InGaAs flattening layer 235 grown before the active region 210 at a distance sufficient to minimize the straining effects on the quantum well layers 220 generally has the effect of flattening the surface to which the active region 210 is disposed. The distance between the flattening layer 235 and the quantum wells 220 can be several hundred angstroms. Growing this flattening layer 235 between the lower confining layer 201 and the first mirror stack 205 flattens out these molecular steps. The surface can be further flattened when the epi layers are grown on "100 or 111 on" orientation substrates. If the substrate is in "off" orientation, the number of molecular steps can increase and the likelihood of bunching of steps increases, thereby increasing the likelihood for dislocation. By flattening the surface that the stacks are deposited on, the strain between layers can be further increased through the addition of greater amounts of In or Sb in the active region. This increased In or Sb generally decreases the band gap energy, thereby making it easier to grow VCSELs 201 that emit longer wavelengths.

Figure 14:
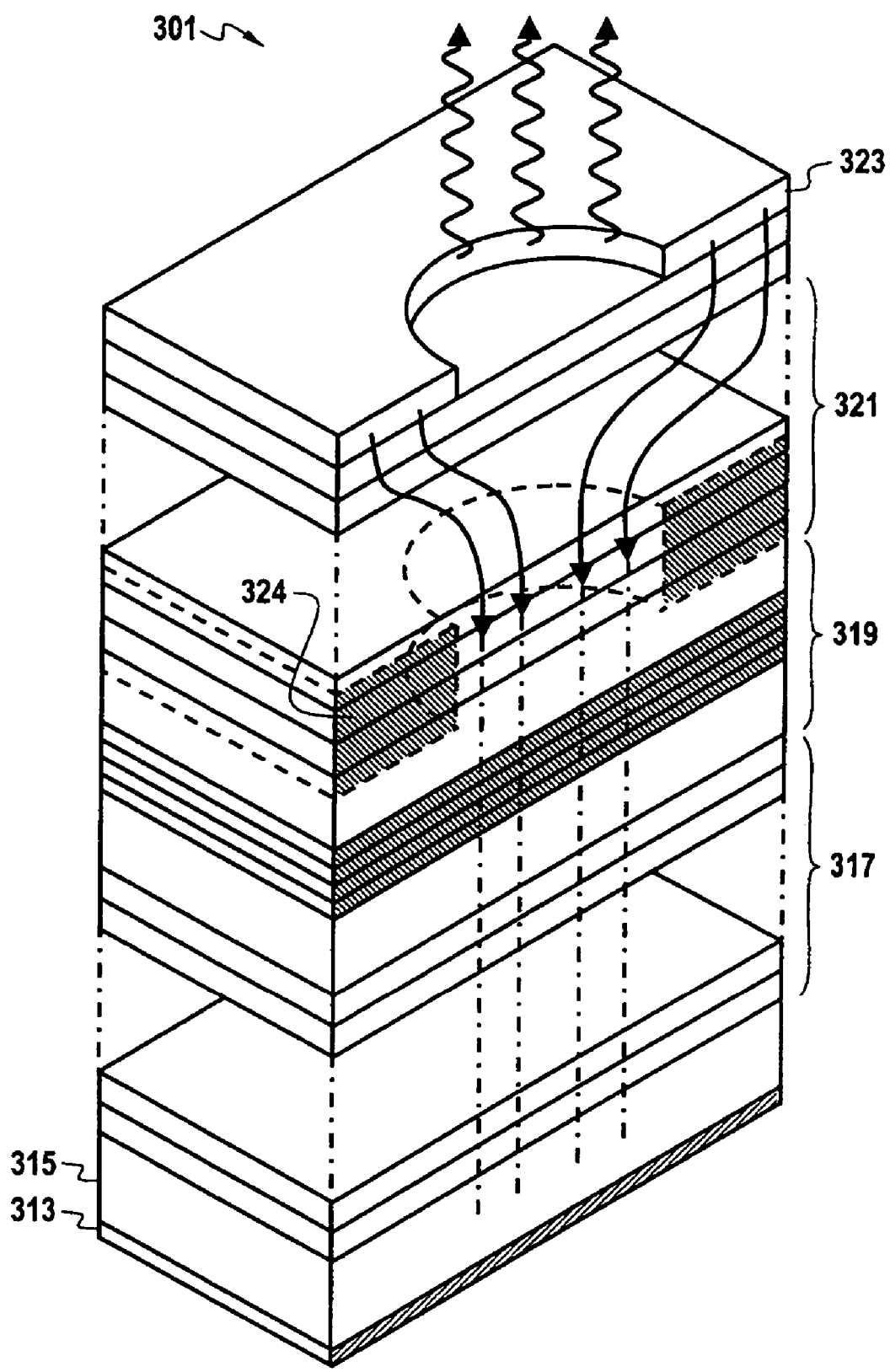
FIG. 14 is a perspective representation of a VCSEL according to the present invention.

As seen in FIG. 14, a VCSEL 301 has, as viewed from the bottom up, a metal contact layer 313 adjacent and a first conductivity type, in this case N type, substrate 315 upon which is deposited an N type mirror stack 317. The active region 319 is adjacent the N type mirror stack and is comprised of GaAs barrier layers and InGaAs quantum well layer as further explained below. On top of the active region 319 is deposited a second conductivity type, in this case P type, mirror stack 321 upon which is deposited a P metal contact layer 323. A current blocking region 324, as known in the art is disposed in the P type mirror stack 321.

Although structures detailed in the preferred embodiment, except the active layer, are of ordinary construction; other structures or layers not detailed herein but known to those having ordinary skill in the art may of course be added to the structures presented herein.

As discussed above, there are certain problems with maintaining mechanical stress in long wavelength VCSEL layers necessary for at least 1.3 micron emission when attempting to use GaAs substrates with InGaAs quantum well layers, and AlGaAs mirrors, i.e., common materials deposited through the use of common processing/fabrication equipment, such as MOCVD or MBE.

Figure 15:
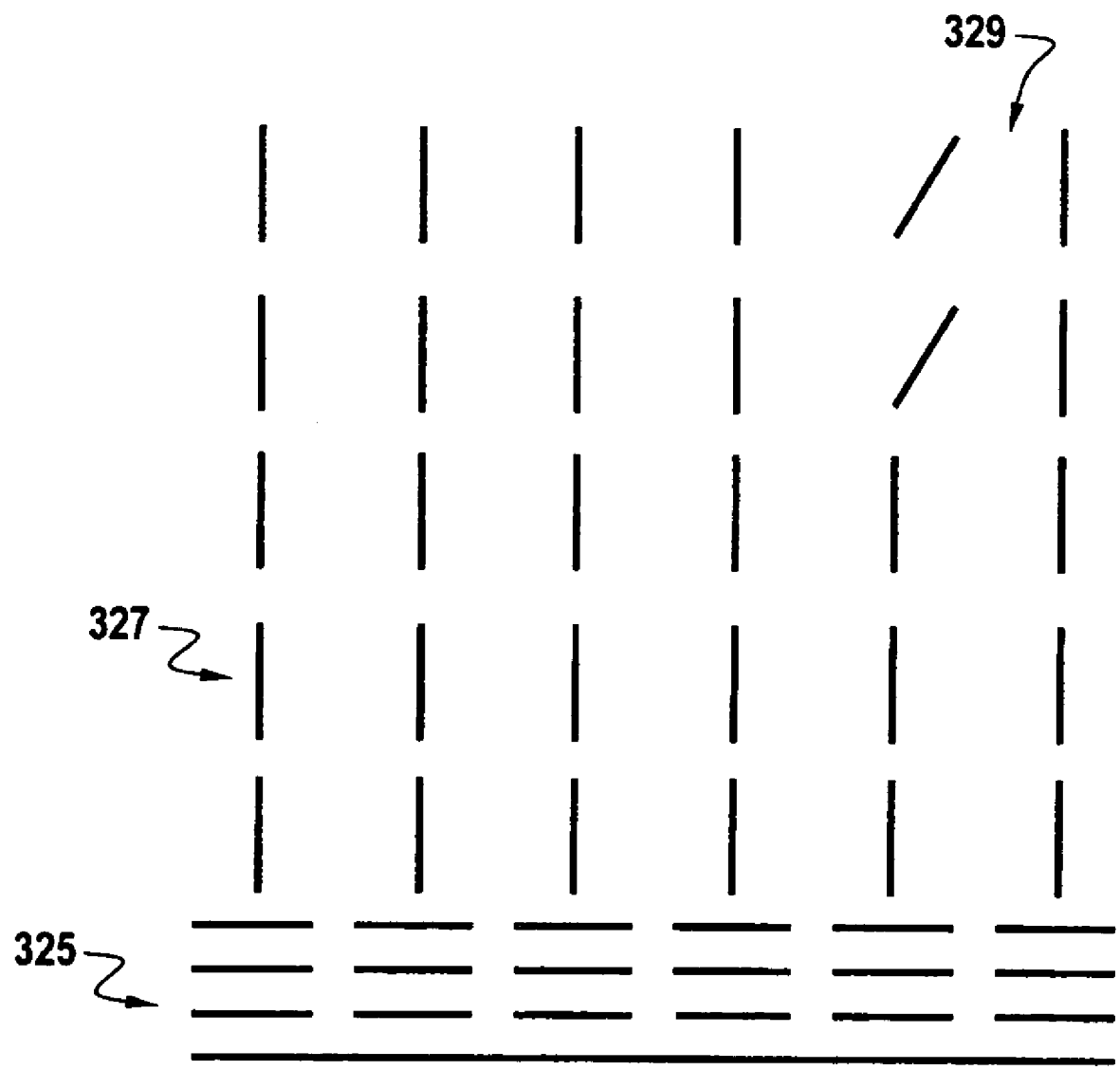
FIG. 15 is a schematic illustration of InGaAs lattice relaxation on a GaAs substrate.

As seen in FIG. 15, a schematic representation of a GaAs layer 325 upon which is deposited an InGaAs layer 327, because these two materials have different lattice constants, when one attempts to deposit too thick of a layer of InGaAs upon the GaAs layer beneath it, or substrate, at a certain point the mechanical strain of the InGaAs will relax, as shown at 329, causing a dislocation, slip line, or damage point which will negate or interfere with proper lasing activity. Unfortunately, a certain thickness must be maintained in order to obtain the proper energy levels to produce the longer wavelength lasing, i.e., 1.3 micron. Thus, the InGaAs layers should be made thinner.

Figure 16:
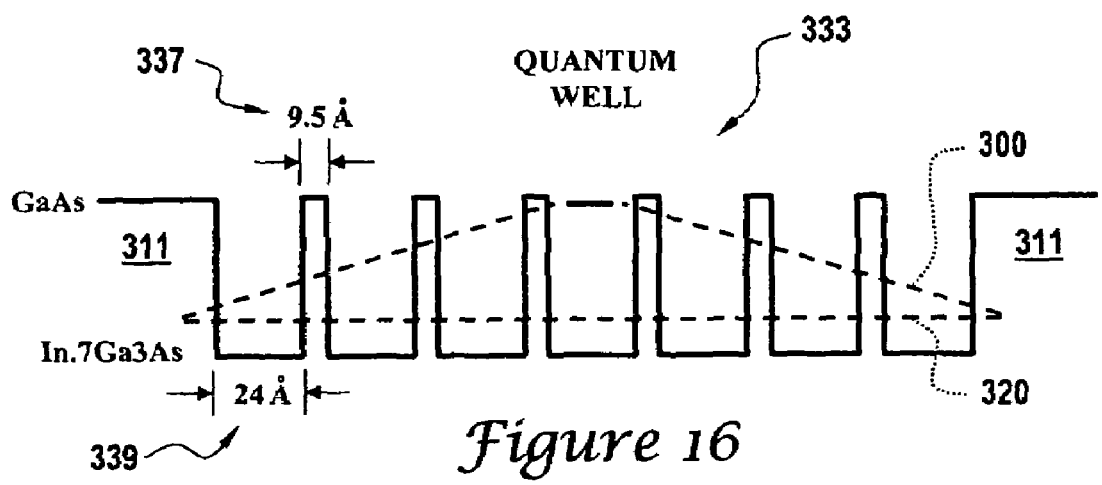
FIG. 16 is a schematic view of the energy bands versus depth of an active portion of a 1.3 micron VCSEL according to the present invention.

As shown in FIG. 16, an energy versus position plot, a two hundred twenty five angstrom quantum well 333 is composed of InGaAs and surrounded on either side by barrier layers 311 composed of GaAs. Within the quantum well structure 333 can be located six substantially equidistant, 9.5Å thick, gallium arsenide spacer layers 337 surrounded by seven InGaAs layers 339 of approximately 24Å thickness. A wave function line 300 and minimum allowable energy line 320 for the active region are included in the plot. There may be other arrangements of GaAs spacer layers, such as two or four layers within the quantum wells, and it is probable that the InGaAs and GaAs layer widths will have to be multiples of the lattice constant. Thus the thickness of the quantum well may change slightly to achieve optimal lasing performance.

It should be noted that the mechanically stabilized quantum wave functions extend into the GaAs barrier layers 311. The dimensions are selectable such that the lattice strain of the mechanically reinforced InGaAs layers 339 causes band splitting that modifies the InGaAs band gap. The GaAs mechanical stabilizer layer thickness, the InGaAs layer thickness, the InGaAs composition and the total well thickness or width, will determine the position of the quantum levels 19 relative to the band edge. However, it is believed that the dimensions shown are close approximations to be desirable for indium 7 gallium 3 arsenide composition of the InGaAs layer.

Figure 17:
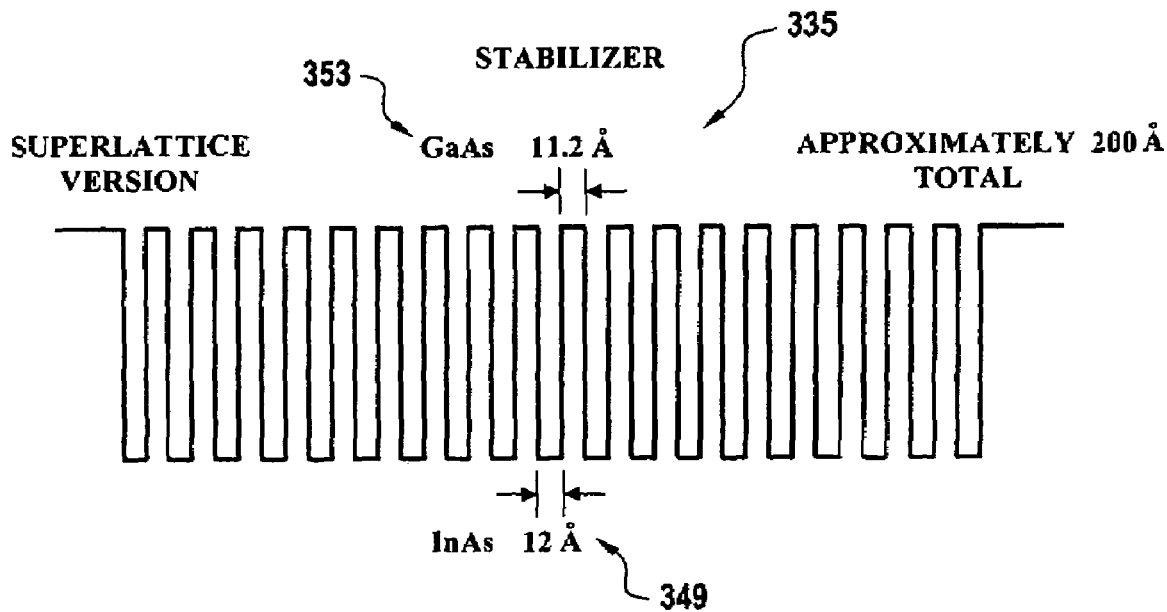
FIG. 17 is a schematic view of an alternative quantum well structure according to the present invention.

As shown in FIG. 17, alternative forms of a quantum well may be constructed according to the present invention. The quantum well 335 may be about two hundred angstroms wide with a superlattice of equidistant stabilization layers 353 of 11.2 angstrom GaAs substrate material surrounded by InAs semiconductor alloy layers 349 of each about 12 angstroms.

The mechanical stabilization layered quantum wells according to the present invention are to be constructed using ordinarily known etching and deposition techniques for standard MOCVD equipment or MBE equipment.

Figure 18:
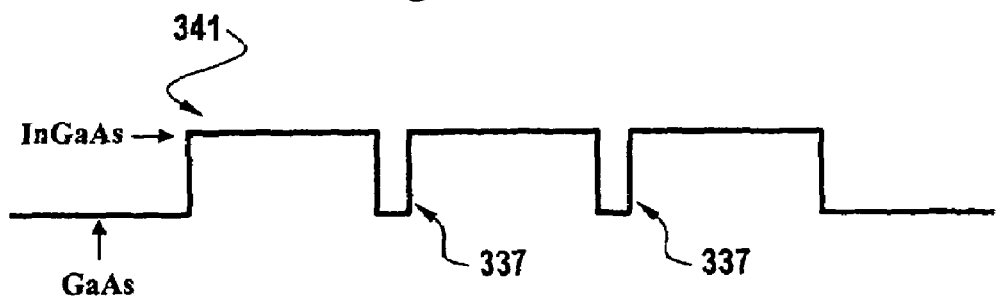
FIG. 18 illustrates a schematic representation of the mechanical energy within the mechanically stabilized InGaAs quantum well using the GaAs stabilization layers.

In one embodiment of the present invention, the quantum wells are surrounded by GaAs barrier layers upon which it is suitable to deposit high efficiency AlGaAs mirrors whose lattice constant matches that of the GaAs barrier layers. A mechanical energy graph representation line 341 is shown in FIG. 18 to illustrate that the strain is kept on the InGaAs layer at a level above that of the GaAs mechanical stabilizers 337 which is in an unstrained state due to lattice constant matching.

During the growth process the strained epitaxial layer follows the lattice constant of the substrate until it passes the critical thickness. At this thickness, instead of maintaining the strain it is relaxed with dislocations. By keeping the thickness under the critical thickness the layers do not relax and form dislocations. The GaAs mechanical stabilizers are not strained because they follow the lattice constant of the substrate. Growing an InGaAs layer on the GaAs mechanical stabilizer is similar to growing one on an associated substrate. The total thickness of the quantum well can then be arbitrarily large exceeding what one would calculate for the critical thickness.

Figure 19:
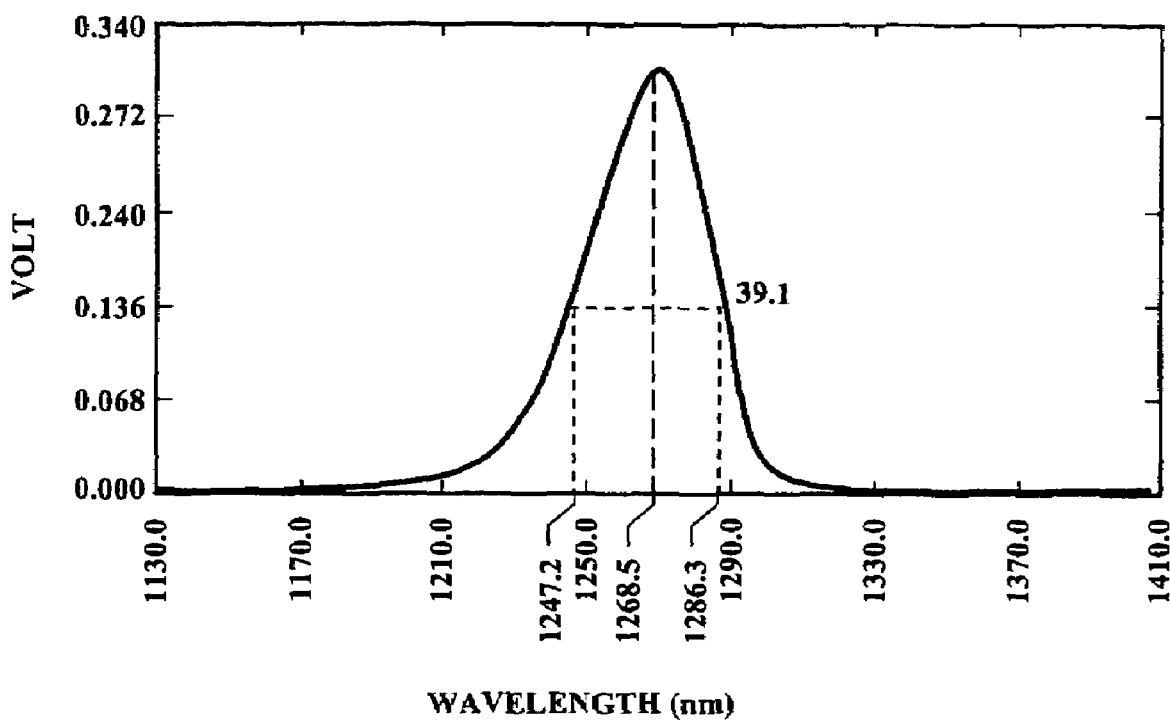
FIG. 19 illustrates a graphical illustration of the output waveform for a quantum well containing little nitrogen.
Figure 20:
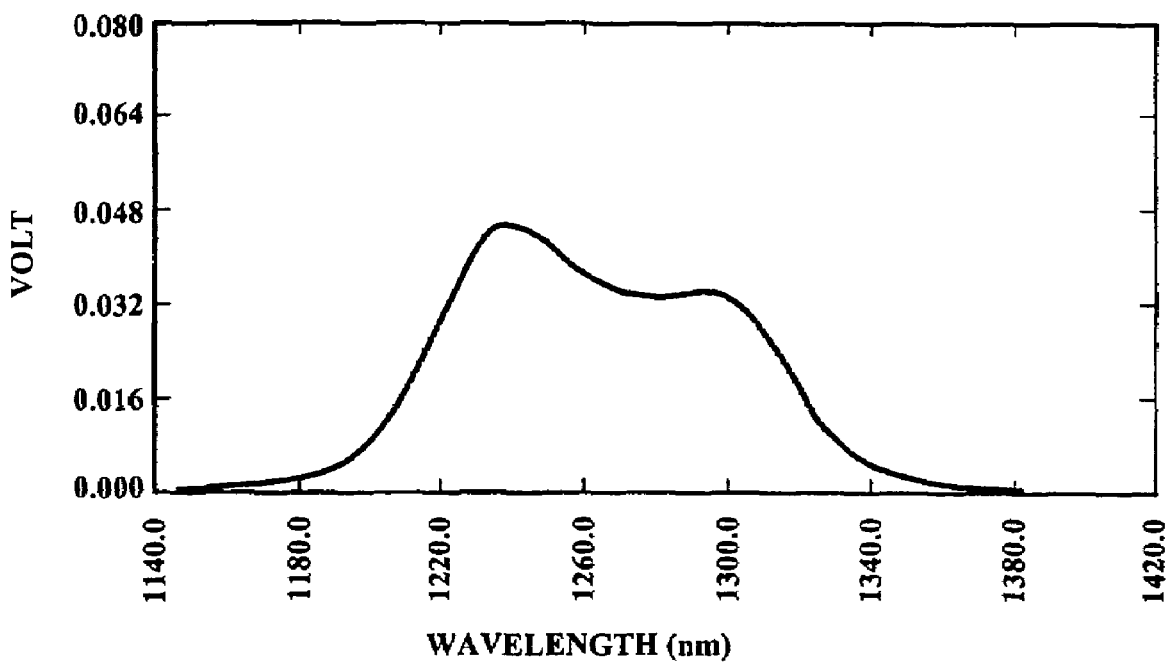
FIG. 20 illustrates a graphical illustration of the output waveform for a quantum well containing nitrogen and experiencing 3-D growth.

Quantum wells containing nitrogen tend to grow in a 3-dimensional fashion. FIG. 19 graphically illustrates the photoluminescence spectrum for a quantum well having nitrogen, but which has not grown in a 3-dimensional fashion. As can be seen from the graph, the quantum well provides an acceptable spectrum with a single narrow peak. Referring to FIG. 20, however, a subsequent sample with the same nominal structure as that shown in FIG. 19 is now shown to be experiencing some 3-D growth, as evidenced by the broad multi-peaked spectrum. Broad double peaks shown in the graph imply quantum dot development or segregation. Quantum wells that contain any amount of nitrogen can experience 3-D growth, thereby causing broadening of the spectrum as well as enabling the formation of quantum dots. By flattening the adjoining surface (e.g. typically the barrier layers) just before the growth of nitrogen containing quantum wells, no seed is provided or made available for 3-D growth within the quantum well layers of a device. Sometimes barrier layers associated with a quantum well will contain nitrogen as well, therefore any non-nitrogen layer should be flattened prior to growth of the nitrogen containing layer whether the nitrogen-containing layer is a barrier layer or quantum well.

Figure 21:
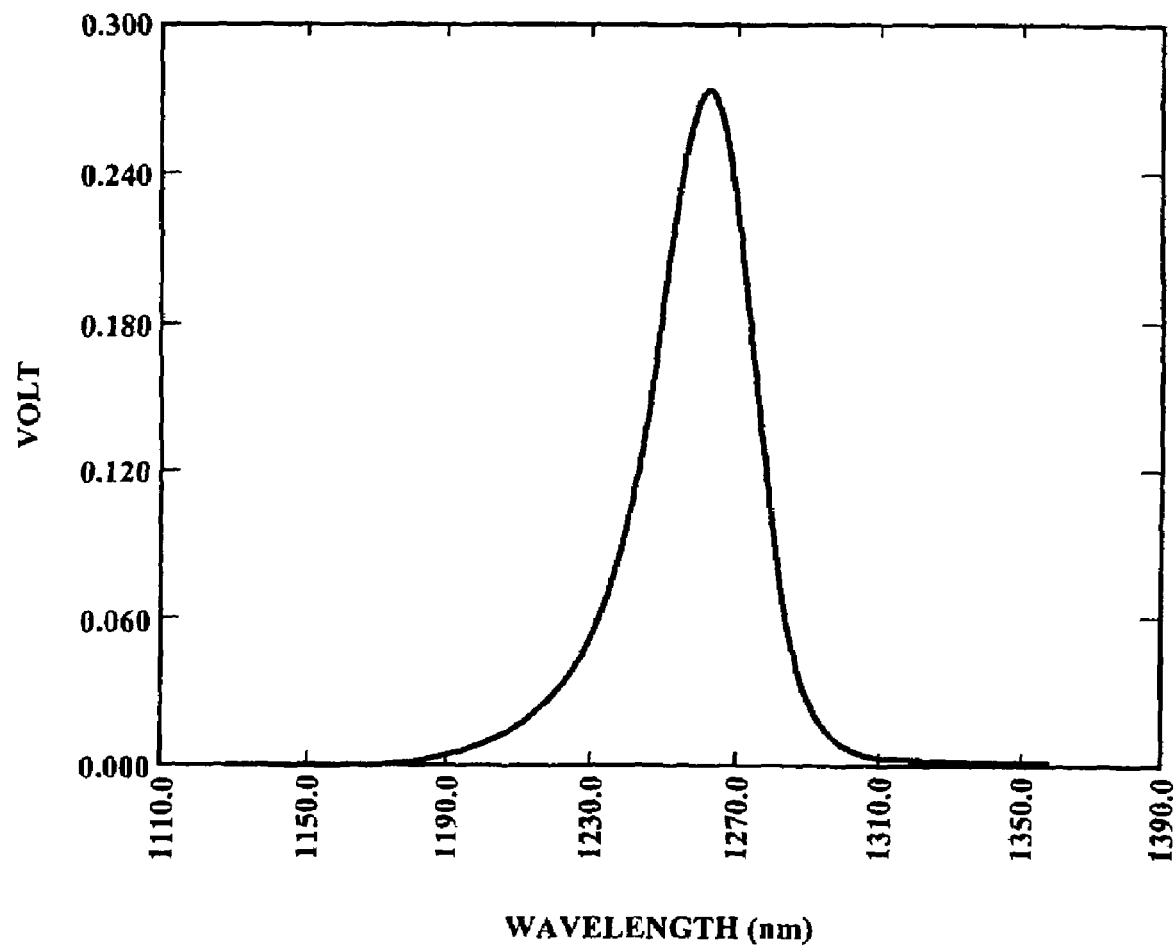
FIG. 21 is a graphical illustration of a desirable photoluminescence spectrum where a device includes nitrogen in its active region.

The present inventors have found that Migration Enhanced Epitaxy (MEE) can be provided as a solution for flattening surfaces, and thereby eliminating quantum dot production or other 3-dimensional growth effects. Referring to FIG. 21, a graphical illustration of a more desirable photoluminescence spectrum is shown. It is well known that spectral measurements using photoluminescence can be used to reveal the results of a MEE processed device.

MEE can be used to flatten device layers before steps are taken to grow nitrogen containing quantum wells, or associated barrier layer, resulting in desirable long wavelength spectra. In a device that uses nitrogen and any combination of In, Ga, As and Sb in the quantum wells and/or any combination of In, Ga, As, N, Sb and P in the barrier layers, using a flattening layer before the growth of any nitrogen containing layers can be very beneficial. Using MEE, for example, before, and/or after and/or between a nitrogen-containing quantum well has been shown by the present inventors to flatten a surface such that there is no seed available for 3-D growth.

According to the present invention, the use of MEE for achieving flattening can be performed by alternately depositing single atomic layers of group III constituents and group V constituents. In particular Ga and As work well on a GaAs substrate.

MEE and the use of growth interruptions to flatten surfaces are common epitaxy techniques regularly used in MBE (molecular beam epitaxy), and sometimes in MOCVD (metal-organic chemical vapor disposition) or MOVPE (metal-organic vapor phase epitaxy) processes. MEE is also commonly described in textbooks describing epitaxy processes, but the use of MEE has not been taught or described in the prior art for the purpose of controlling the production of semiconductor laser quantum wells containing nitrogen. The use of gate valves may be known in the art, but have not been proposed for the purpose of effectively implementing MEE by blocking nitrogen during layer processing using MBE, MOCVD and MOVPE systems.

Quantum wells containing InGaAsN with optional Sb do not exist in equilibrium. Phase segregation can take place as a result where equilibrium is not maintained. To avoid phase segregation within quantum wells, low growth temperatures have been used during processing. Unfortunately low growth temperatures can result in point defects, which can cause poor optical quality in the device. Furthermore, higher growth temperatures can be effectively maintained in InGaAsN quantum wells, and can thus result in high quality optical material if a high flux of As is also used. High As flux can eliminate Group III dangling bonds and also prevent the physical motion of constituents responsible for enabling phase segregation. During the growth of nitrogen containing layers it has been found beneficial to use As fluxes of at least 1.1e−5 torr beam equivalent pressure. Preferably, 1.65e−5 torr beam equivalent pressure is used. In addition, the use of predominantly $As_4$ vs. $As_2$ has been found to further inhibit 3-dimensional growth.

A monolayer of Ga with no As to stabilize it migrates rapidly and flattens the surface. Reflected high energy electron diffraction, RHEED is a useful technique to determine that a surface is flat. A high RHEED oscillation amplitude generally indicates that the surface is flat. Optimum device results can be observed where a maximum RHEED oscillation signal is achieved with a substrate temperature of about 400 C. during the MEE process.

High flux can be achieved when beam pressure of As is maintained above 1.1e−5 Torr, and preferably about or above 1.65e−5 Torr. This is a much higher beam equivalent pressure setting than is normally used for such quantum wells. Pressure achieved under these conditions can prevent phase segregation and enable quantum well growth at elevated temperatures ~400 C. In addition, the present inventors have determined that $As_4$ can be a more advantageous arsenic source than the more commonly used form $As_2$, while enabling the maintenance of acceptable flux guidelines. $As_4$ instead of $As_2$ should be used to achieve high As pressure. Changing the species of arsenic can be as simple as changing the cracker temperature, where ~900 C. cracker temperature can give predominantly $As_2$, while less than 650 C. can predominantly result in $As_4$.

RHEED measurements made at a substrate temperature of ~400 C. can be used to help develop the process by maximizing the RHEED oscillation amplitude. This resulted in 2 seconds of Ga at 0.5 ml/sec, and 4 seconds of As to recover the surface. Ten (10) molecular layers of GaAs can be used at the beginning of each barrier layer without the introduction of nitrogen, which is possible when a gate valve is used, which can completely eliminate the introduction of nitrogen from the nitrogen source.

Carrier relaxation into typical quantum wells can take a significant length of time (typically about 10 ps, which can be significant for some applications), which can cause high speed devices to be slower than is generally desirable. In addition, carrier leakage past quantum well active regions is a familiar problem with regard to the resulting efficiency of most quantum well light emitters.

Figure 22:
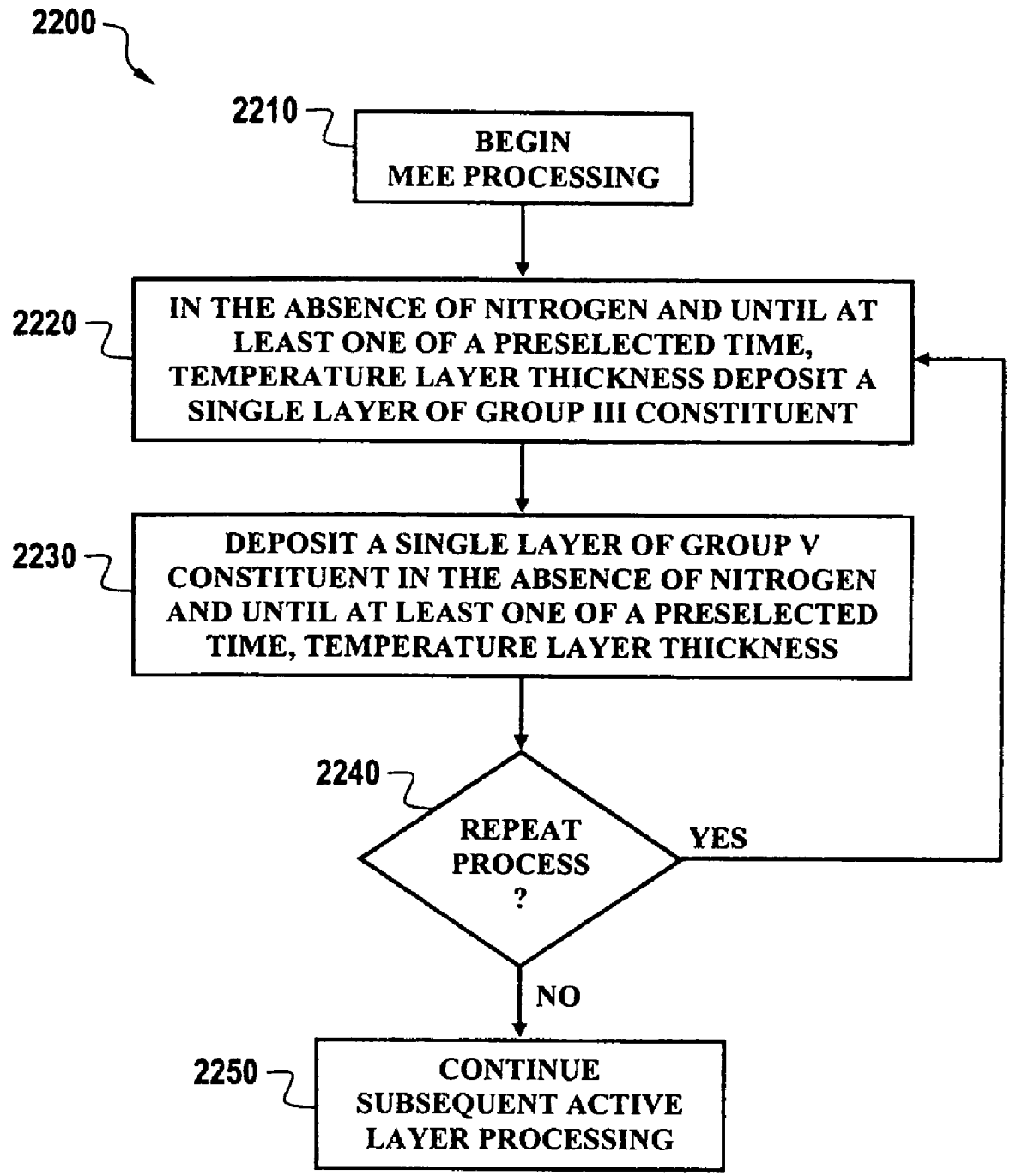
FIG. 22 illustrates a flow diagram of steps that can be taken to fabricate Nitrogen containing active regions and achieving layer flattening.

Referring to FIG. 22, a flow diagram is shown 2200 outlining steps that can be taken during device fabrication to achieve layer flattening throughout an active region using MEE processing techniques. The present inventors have found that layer flattening within a semiconductor laser active region can occur by alternating the growth of As and Ga, which are referred to herein as an example of material that can be used, but should not be taken to be a limitation of the present invention. MEE processing begins as shown at step 2210. As shown in step 2220, a group III material such as Ga is used during processing of a first layer. During this step, the process is to deposit a single layer of a group III constituent in the absence of nitrogen and until at least one of a preselected time, temperature, and layer thickness is met. Next, as shown in step 2230, a group V material such as As is used during processing of a second layer. During this step of the process a single layer of group V constituent is deposited in the absence of nitrogen and until at least one of a preselected time, temperature, and layer thickness is met. As shown in Step 2240, steps 2220 and 2230 can be repeated until at least one of a preselected time, temperature, or number of alternating layers is achieved. Finally, as shown in step 2250, the process can then be transitioned to subsequent active region/layer processing as shown when the process of steps 2210-2240 is completed.

Non-nitrogen steps of the MEE process can be carried out by alternately opening and closing Ga and As shutters so that they are not both open at the same time, and so that the time the Ga shutter is open deposits 1 atomic layer. In an example, the present inventors opened a 0.5 monolayer per second Gallium source for 2 seconds alternating with the As source for 4 seconds. During the time the Ga source was open without As, the Ga atoms migrated long distances to find steps. This resulted in flattening of the surface.

The present inventors have found that, while the Ga shutter is closed and the As shutter is open the surface becomes arsenic stabilized, and after a waiting period the surface will flatten even further. The growth temperatures, As vapor pressures and sticking coefficients can be such that a substantial excess of As is required.

With nitrogen containing quantum wells that are normally used in MBE, however, it is important to be able to effectively shut off any nitrogen source while attempting to grow a MEE structure. The present inventors have incorporated a gate valve on the source line leading into an MBE system in order to accomplish complete nitrogen blockage. It was found that shutters are only minimally useful to interrupt the nitrogen.

Figure 23:
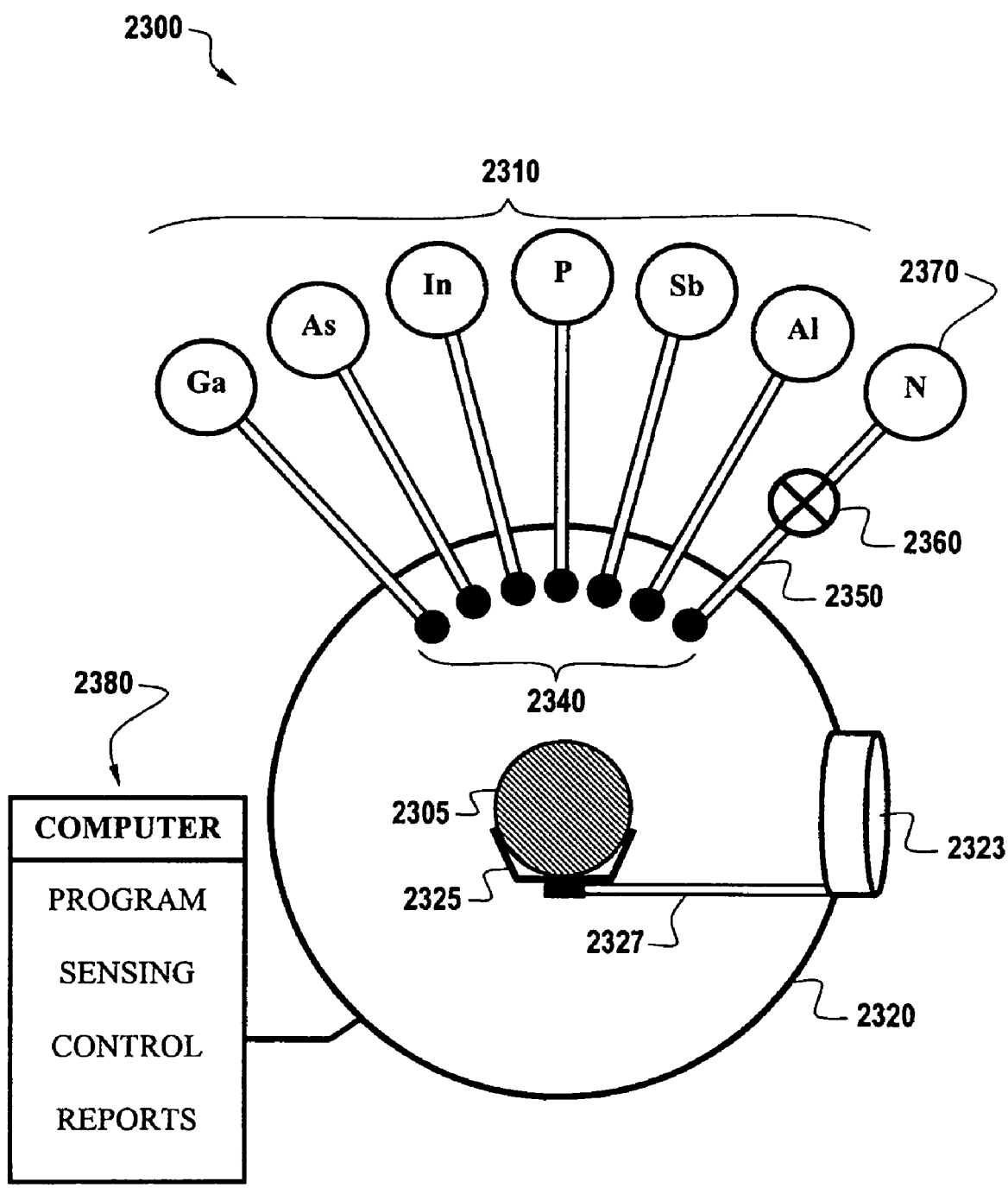
FIG. 23 illustrates a block diagram of a system that can be used to carry out the methods of the present invention.

Referring to FIG. 23, an MBE system 2300 is illustrated having a semiconductor wafer processing chamber 2320. A typical processing chamber can include a port 2323 where through a semiconductor wafer 2305 can be placed onto a wafer holder 2325. The wafer holder, with wafer, can then be placed into an optimal processing position within the chamber 2320 via a track 2327. Several sources 2310 (e.g., Ga, As, Sb, In, P, N, etc.) can lead into the chamber 2320. Each source 2310 is generally controlled in the chamber with shutters 2340. Unfortunately, use of a shutter has not been effective in blocking nitrogen 2370 for MEE processes.

Therefore, a gate valve 2360 can be spliced into the nitrogen source line 2350. The gate valve 2360 can be used to completely cut-off the flow of nitrogen 2370 into the chamber 2320 during non-nitrogen MEE processing steps.

Complete nitrogen cut-off can be achieved with manual (i.e., a human operator), electro-mechanical and/or microprocessor control of a microprocessor, or operator (not shown). A microprocessor-based system 2380 will commonly be used with the processing hardware (e.g., chamber, shutters, gate valves, etc.) for executing programmed processing instructions (e.g., software programs), collect measured data from measurement transducers (not shown), provide and maintain processing control, report creation, and data/software storage.

Figure 24:
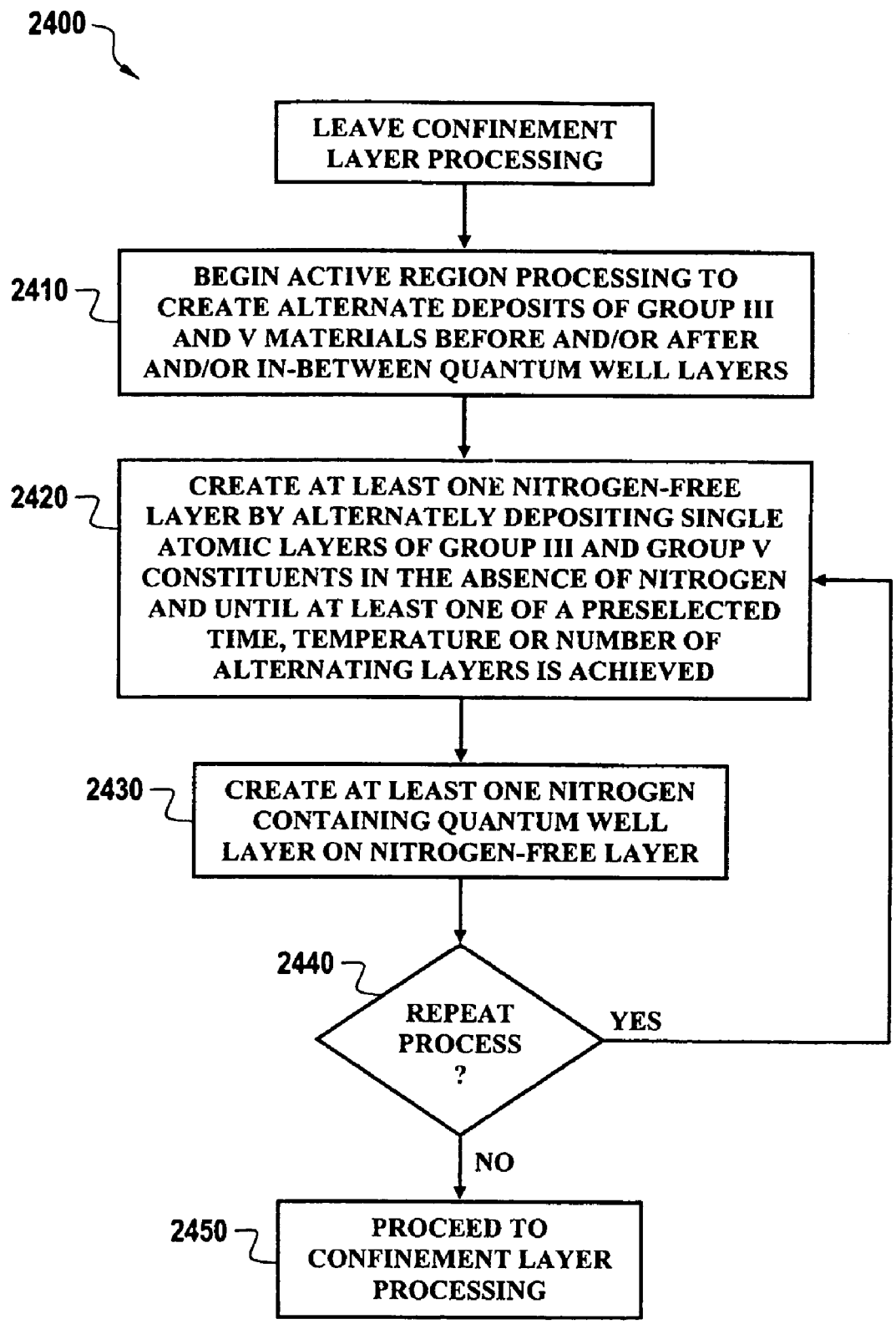
FIG. 24 is an illustration of a flow diagram of steps that can be taken during semiconductor laser wafer fabrication to create an active region while maintaining flattening of layers within active regions.

Referring to FIG. 24, a flow diagram 2400 illustrates steps that can be taken during semiconductor laser wafer fabrication to create an active region while maintaining flattening of layers within the active region, thus producing higher performance quantum wells than have been heretofore provided. In a preferred embodiment, the present inventors have found that layer flattening can occur by alternating the growth of group III and V materials. The process can begin as shown at block 2410 after creation of a confinement layer that typically precedes the active region. As shown in step 2420, at least one nitrogen-free layer by alternately depositing single atomic layers of group III and group V constituents and until at least one of a preselected time, temperature and number of alternating layers is achieved. Processing for step 2420 can be carried out using the process steps shown in FIG. 22. Next, as shown in step 2430, at least one nitrogen-containing layer can be created on the nitrogen-free layer resulting from step 2420. The nitrogen containing layer produced in step 2430 will typically result in a quantum well or barrier layer that can include GaAs and one or more of antimony, indium and phosphorous. Then as shown in Step 2440, steps 2420 and 2430 can be repeated until a preselected time or a desired number of alternating layers are achieved. Once the process of creating an active region is completed, which is generally once a device with the desired number of quantum wells is rendered from the process, the process can transition to subsequent device processing steps as shown in step 2450.

Figure 25:
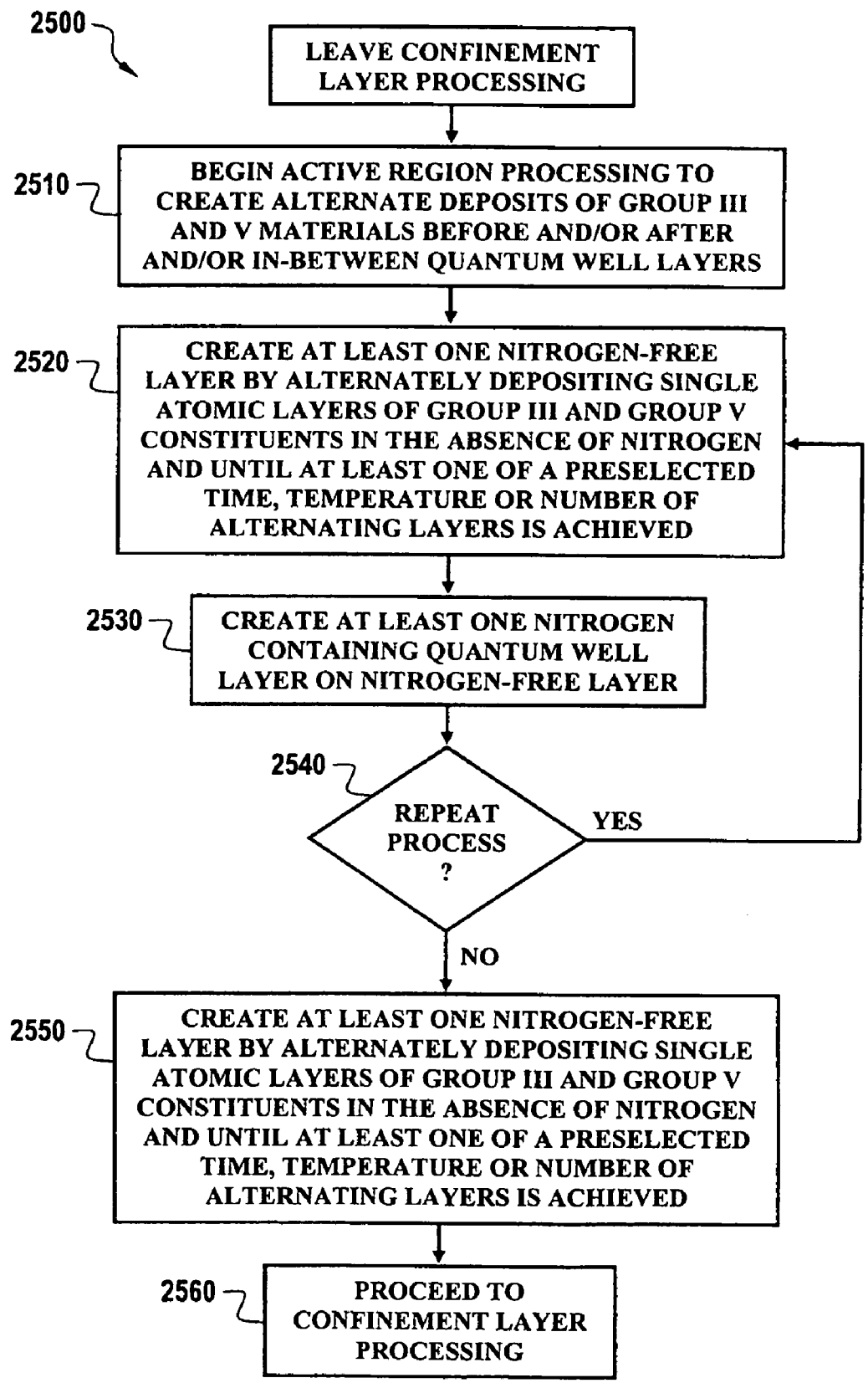
FIG. 25 is an illustration of another flow diagram of steps that can be taken during semiconductor laser wafer fabrication to create an active region while maintaining flattening of layers within the active region.

Referring to FIG. 25, a process 2500 similar to that shown in FIG. 24 is shown, however, once steps 2410-2440 are completed, a nitrogen-free layer can be created in Step 2550. The layer created in Step 2550 can be similar to that created in Step 2420. Once the process of creating an active region is completed, which is generally once a device with the desired number of quantum wells is rendered from the process, the process can transition to subsequent device processing steps as shown in step 2460. It should be noted that diffusion will occur in most epi processes such that some nitrogen will be included in the initially nitrogen free layer. The most important part of flattening is that the layer is substantially nitrogen free when it is grown. It should also be pointed out that other flattening techniques can be used, but with any of these techniques it is important that a nitrogen free layer be used for flattening.

In addition to achieving layer flattening, it has also been discovered that the shape(s) of the quantum wells can further enhance the device's ability to capture electrons and holes, thereby improving the overall efficiency of the semiconductor laser device. The present inventors have developed improved barrier layer and quantum well designs that can improve quantum well carrier confinement. Furthermore, the improved designs enable carrier injection at lower energies, which can result in reduced relaxation time.

Figure 26:
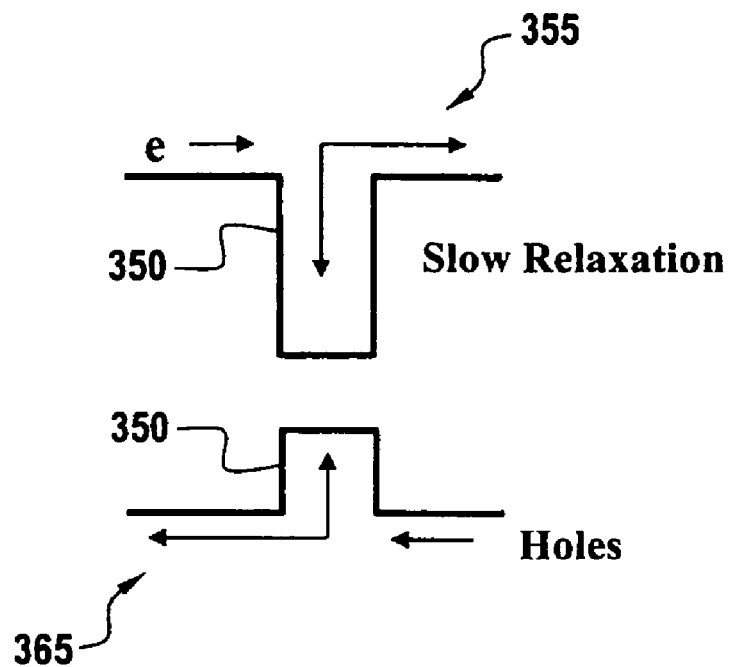
FIG. 26 is a diagram illustrating common electron and hole leakage problems experienced within active regions in most high speed optoelectronic light emitters.

As shown in FIG. 26, common problems experienced within active cad z as regions in most high speed optoelectronic light emitters are with electron leakage 355 and hole leakage 365. With electron leakage 350, some electrons "e" entering the active layer tend to migrate past the quantum well 350 and recombine outside the quantum wells so that the recombination energy is useless to promote lasing. As with electron leakage, some "holes" moving in the device, opposite the active region, can tend to migrate past the quantum well to recombine outside the quantum wells 360, which can be referred to as hole leakage.

Figure 27:
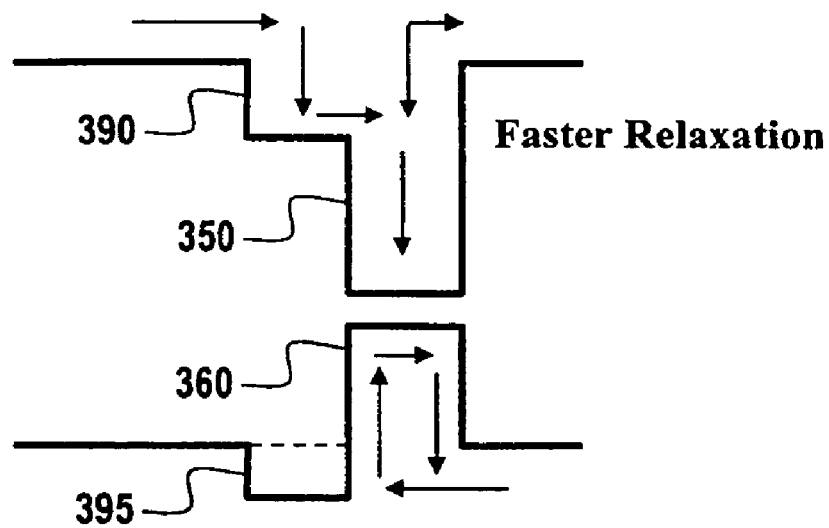
FIG. 27 is a diagram illustrating how a reduction in part of the barrier layer edge within the conduction band on the input side of the quantum well can enhance the probability that electrons can be captured and/or retained within the quantum well.

During normal operation, thermal energy generally spreads the population of electrons above the conduction band where collisions with phonons must occur for the electron energy to be reduced such that it can fall into a quantum well. Referring to FIG. 27, a reduction in part of the barrier layer edge 390 within the conduction band on the input side of the quantum well can enhance the probability that electrons can be captured and/or retained within the quantum well 350. In addition, a reduced energy can now be expected from phonon collision, thereby reducing phonon collision time, reducing the time it takes the carrier to relax into the well and making the device faster. A similar benefit can be found with regard to holes under the valence band edge wherein a portion of the barrier layer 395 that is associated with the reduced barrier layer edge 390 is extended resulting in an enhanced barrier for capturing holes. The embodiment described herein with respect to FIG. 27 modifies the barrier layers within the active region of a laser device, resulting in what can be referred to as a two-layer barrier system.

Figure 28:
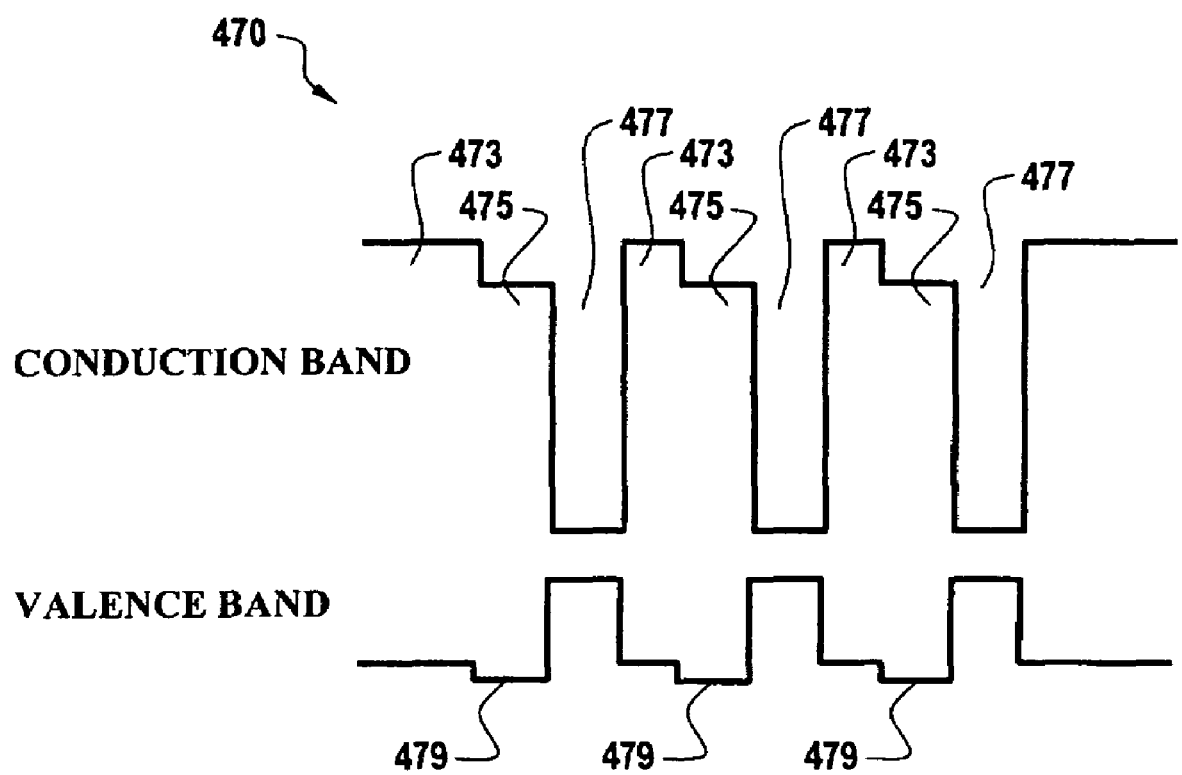
FIG. 28 is a diagram illustrating a three-well device that can be processed to provide the benefits described in FIG. 27.

FIG. 28 illustrates an example of a three-well device 470 that can be processed to provide the benefits described in FIG. 27. In an example two-layer barrier system, a GaAsN layer 475 can be grown next to a GaAs layer 473, and together the combined layers can perform enhanced barrier layer functions in the place of single barrier layers that are normally deployed on either and/or both side(s) of quantum wells 477. GaAs provides a wider gap barrier layer portion 473 of the barrier layer system while GaAsN, which possesses a reverse offset in the valence band when exposed to increasing amounts of nitrogen, can be used for the narrower energy band gap portion 475 of the barrier layer. The use of GaAsN in narrow gap portion 475 can also cause a reverse offset in the valence band offset enhancing the hole blocking ability of barrier sections 479. Finally, InGaAsN, for example, can be used as material for developing the quantum wells 477. A system developed with the above-described materials can provide enhanced electron and/or hole capture in both the conduction and valence bands, respectively. It should be appreciated that other combinations of materials can be used for developing a device providing the phenomenon and benefits as described.

Figure 29:
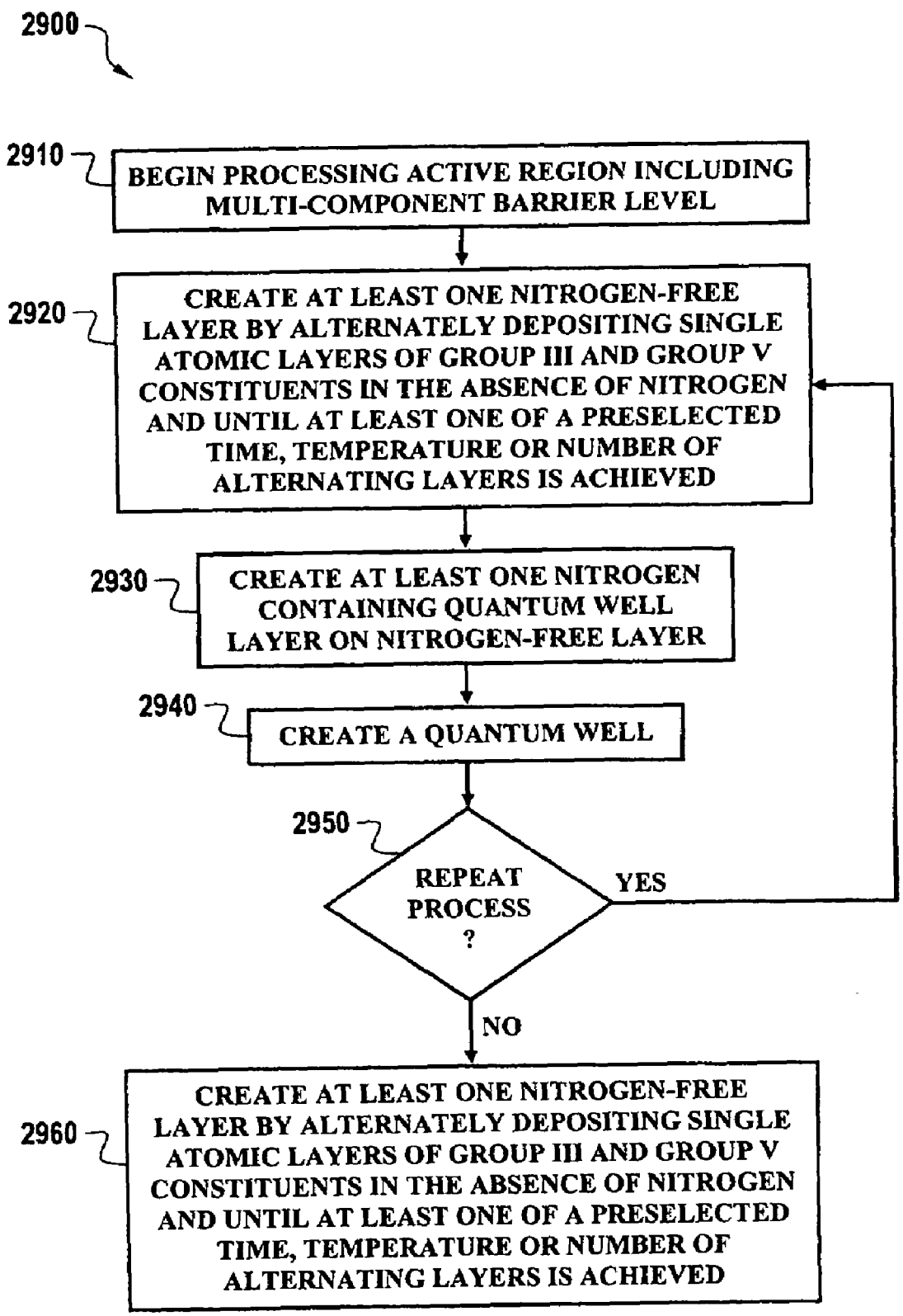
FIG. 29 illustrates a flow diagram showing process steps that can be taken to produce a two-layer barrier system as shown in FIG. 28.

Referring to FIG. 29, a flow diagram 2900 illustrates steps that can be taken to produce a two-layer barrier system as shown in FIG. 28. The process of producing an active region having a multi-component barrier layer can begin as shown in step 2910. As shown in step 2920, at least one nitrogen-free layer can be created by alternately depositing single atomic layers of group III and group V constituents in the absence of nitrogen and until at least one of a pre-selected time, temperature and/or number of alternating layers is achieved. Then as shown in step 2930, at least one nitrogen-containing layer can be created on the nitrogen-free layer. The same materials and process described and shown in step 2920 can be combined with nitrogen to create the layer in step 2930. As shown in step 2940, a quantum well can be created. The quantum well can also contain nitrogen. As shown in step 2950, a decision can be made to repeat steps 2920-2940 where more quantum wells are desired for the active region. Once a desired number of wells have been created, the process can end as shown in step 2960 by creating at least one nitrogen-free layer by alternately depositing single atomic layers of group III and group V constituents in the absence of nitrogen and until at least one of a pre-selected time, temperature or number of alternating layers is achieved the nitrogen-containing layer.

Figure 30:
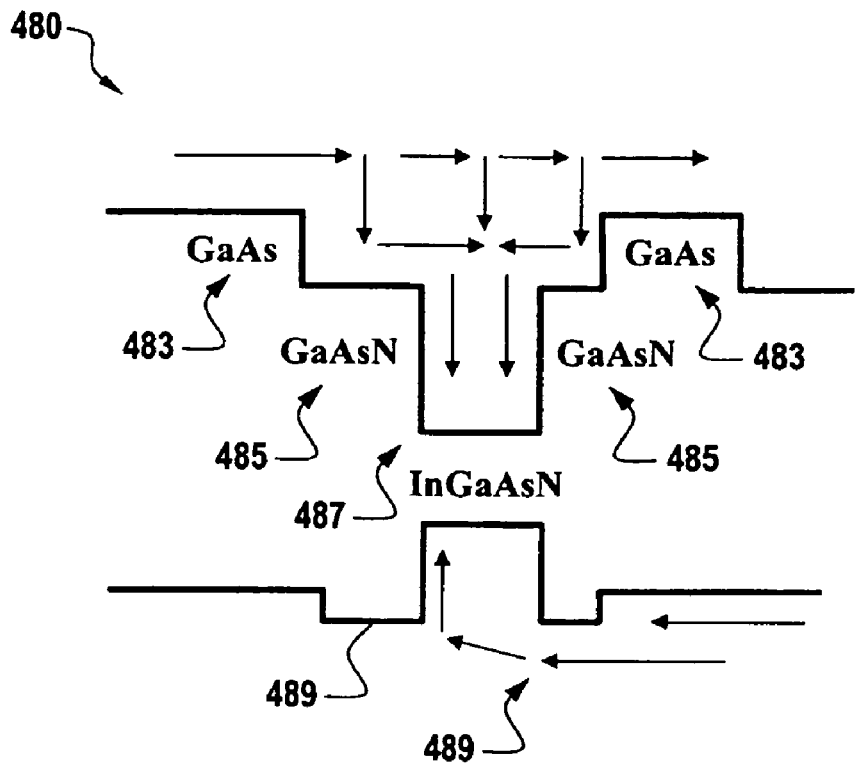
FIG. 30 illustrates a multi-layer barrier system where a semi-conducting laser device can include a three-layer barrier system that uses GaAsN layers deployed or disposed directly on both sides of the quantum wells, and further including a GaAs layer deployed between GaAsN layers.

Referring to FIG. 30, another embodiment for providing a multi-layer barrier system is illustrated. As shown in FIG. 30, a semi-conducting laser device 480 can include a three-layer barrier system that uses GaAsN layers 485 deployed or disposed directly on both sides of the quantum wells 487, and further including a GaAs layer 483 deployed between GaAsN layers 485. Also shown in FIG. 30 is how the quantum well is defined as a result of the barrier layer configuration. An adjustment to barrier sections 489 associated with the nitrogen containing barrier layer sections is shown. There is still adequate hole confinement with a three-layer system design.

Figure 31:
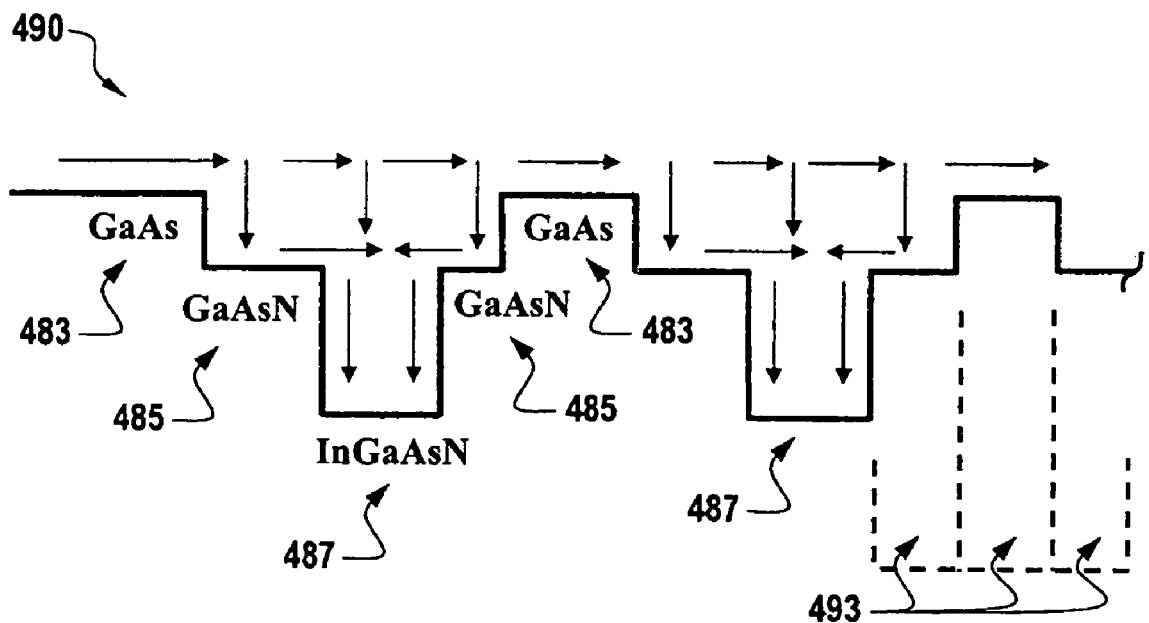
FIG. 31 illustrates a multi-layer barrier system with an active region having more than one quantum well.

Referring to FIG. 31, a multi-layer barrier system 490 having more than one quantum well 487 is illustrated. The multi quantum well device is configured similar to the device shown in FIG. 30. Also shown in FIG. 31 and represented by dashed lines are phantom lines 493 of the layers associated with the two layer and three-layer components that can make up a multi-layer barrier system.

Figure 32:
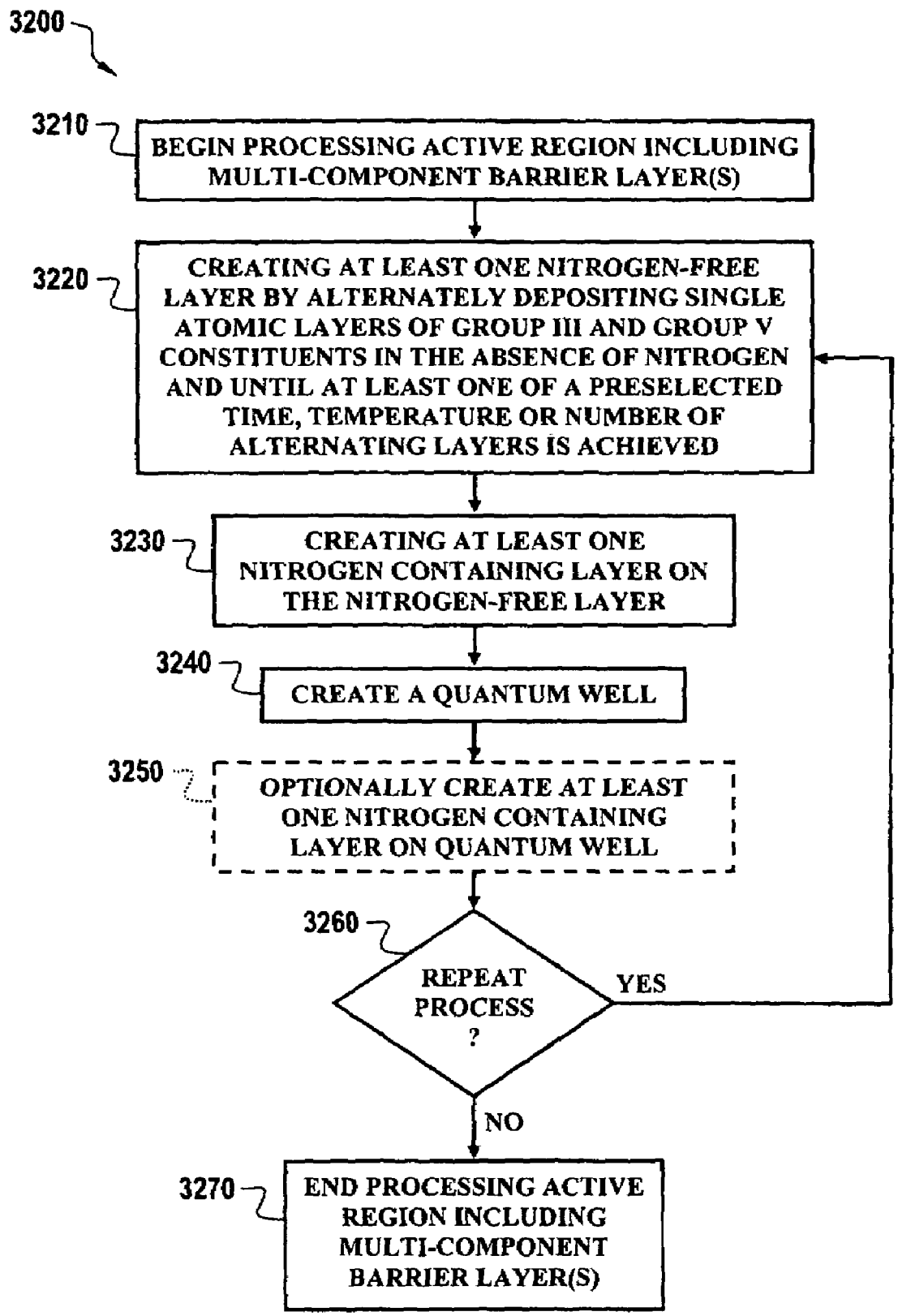
FIG. 32 illustrates a flow diagram of process steps associated with creating multi-component barrier layers.

Referring to FIG. 32, a flow diagram 3200 illustrates the process steps associated with creating multi-component barrier layers. The process can begin as shown in step 3210. At step 3220, at least one nitrogen-free layer can be created by alternately depositing single atomic layers of group III and group V constituents in the absence of nitrogen and until at least one of a pre-selected time, temperature or number of alternating layers is achieved. Then as shown in step 3230, at least one nitrogen-containing layer can be created on the nitrogen free layer. The same materials and process described and shown in step 3220 can be combined with nitrogen to create the layer in step 3230. Then as shown in step 3240, a quantum well can be created. The quantum well can also contain nitrogen. As shown in step 3250, at least one nitrogen-containing layer can optionally be created on quantum well layer provided in step 3240. This will provide the effect shown with layer 485 in FIG. 30. As shown in step 3260, a decision can be made to repeat steps 3220-3250 where more quantum wells may be desired for the particular active region being processed. Once a desired number of wells have been created, the process can end as shown in step 3270.

In addition to the reduction in carrier leakage and the improved speed benefits that can be experienced with the new two- and three-layer barrier system design, it can be appreciated that GaAsN use in barrier layers can also provide strain compensation. Also, even if such a design was only implemented within the conduction band, which is notorious for leakage and speed deficiencies, the operation of the device should be enhanced from realizing most of the discussed benefits. It should also be appreciated that MEE can be used during development of a device including a two-layer barrier system. Furthermore, although the barrier layer design described herein can enhance electron capture for semiconductor lasers with wavelengths longer than 1200 nm, it should be appreciated that such a design can also be useful for semiconductor lasers less than the 1200 nm range (e.g., such as 850 nm VCSELs) or other light emitting devices such as LED's.

Figure 33:
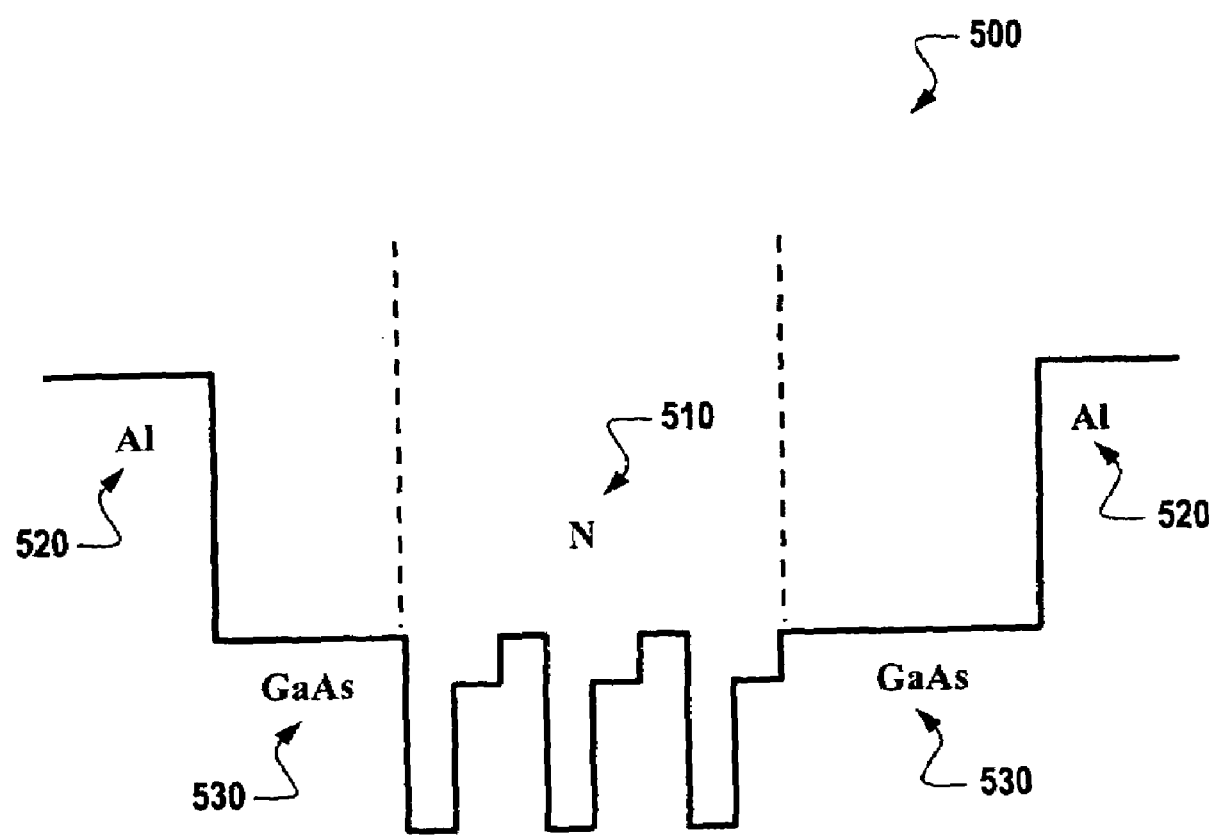
FIG. 33 illustrates another embodiment of the present invention enabling the use of AlGaAs confining layers in devices where active regions contain nitrogen.

Referring to FIG. 33, a device 500 showing another embodiment of the present invention, which enables the use of AlGaAs confining layers 520 in devices where active regions 510 contain nitrogen, will now be described. Active regions 510 in light emitting devices containing nitrogen such as InGaAsNSb or InGaAsN have not been made successfully using AlGaAs confining layers 520. The problem with such devices is that Al-nitrogen pairing can produce deep traps, a phenomenon which enhances non-radiative recombination. As described above with regard to MEE and FIG. 23, by using a positive shutoff on nitrogen sources leading into processing equipment, and by placing the beginning of the confining layers outside the nitrogen-containing region and separating the two areas with an outer, or extended, barrier layer 530 formed of GaAs, a device using Al and nitrogen can be developed and used. Because the optimal temperature for growing AlGaAs is much hotter than for the quantum wells containing nitrogen or Sb, a growth interruption to allow time for the temperature change is optimally performed during the growth of the extended barrier layer.

As with MEE, a gate valve or some other positive shutoff can be used for the nitrogen to completely prevent its introduction in the chamber with Al during device processing procedures using MBE or other processing techniques such as MOCVD.

Introduction of an "extended barrier layer" 530 just outside of the active region that does not contain Al or nitrogen should be grown to compensate for the diffusion of nitrogen during subsequent growth or processing. The nitrogen should not be allowed to diffuse into the Al containing layers. SIMs (secondary ion mass spectroscopy) provides a convenient method to determine how far the nitrogen diffuses.

Figure 34:
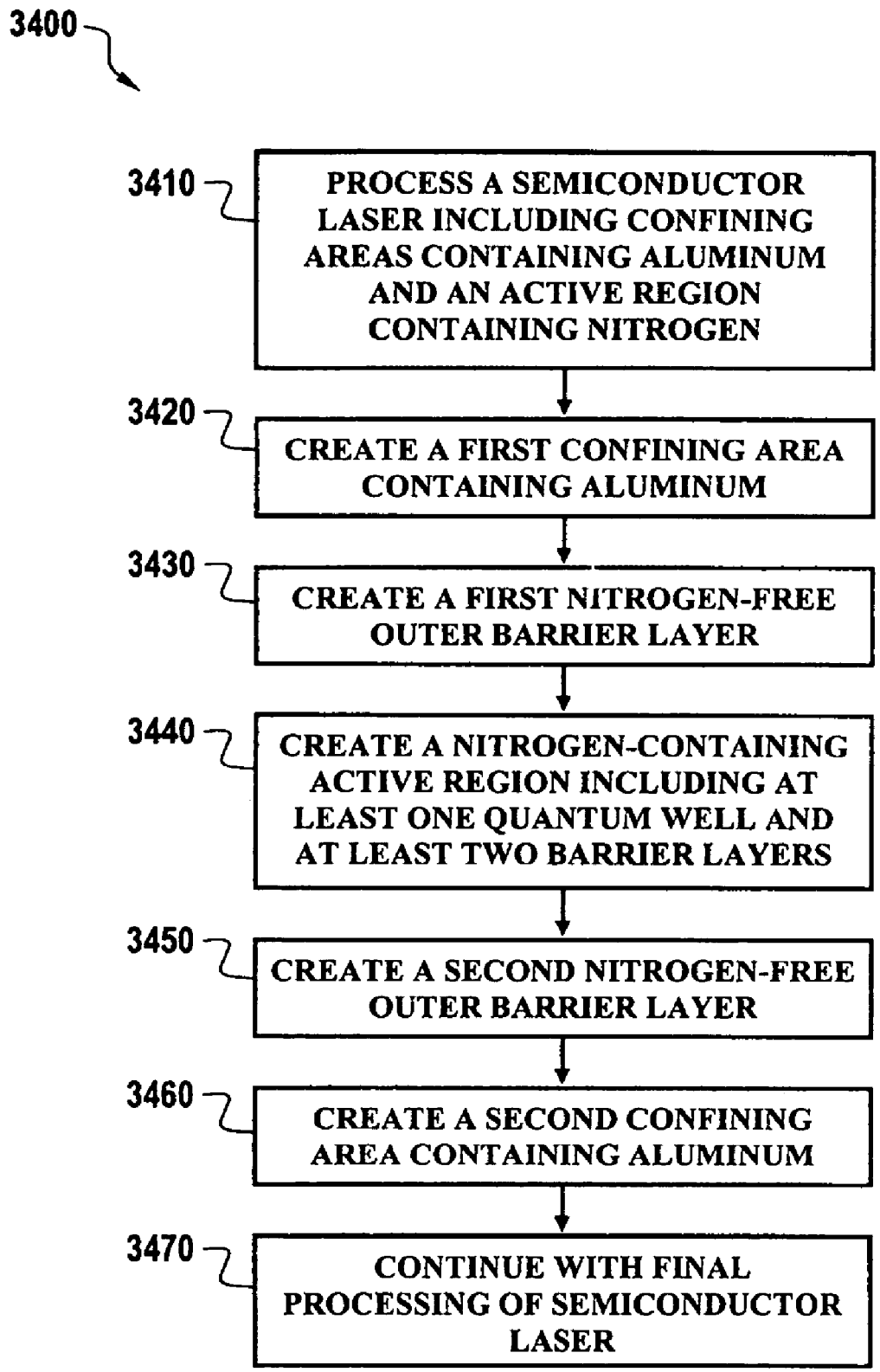
FIG. 34 illustrates process steps for creating a device in accordance with that illustrated in FIG. 33.

Referring to FIG. 34, a flow diagram illustrating process steps for creating a device having extended barrier layers between Al containing layers is shown. The process of developing a semiconductor laser that includes confining areas containing aluminum disposed outside active regions containing nitrogen starts at block 3440. In step 3420, a first confinement area containing Al is formed prior to forming an active region. Next, at step 3430 a first nitrogen-free outer barrier layer is formed. The nitrogen-free outer barrier layer can be considered as associated with either the confinement area or active region, or unassociated, while maintaining the benefit of its Al—N barrier function. As shown in step 3440, a nitrogen-containing active region including at least one quantum well and at least two barrier layers associated with the at least quantum well can be formed. After creation of the active region in step 3440, a second nitrogen-free outer barrier layer can be formed as shown in step 3450. Next, at step 3460 the second confining area containing Al can be formed outside the active region, but after the nitrogen free outer barrier formed in step 3450. Device fabrication and completion steps can then be continued 3470.

Figure 35:
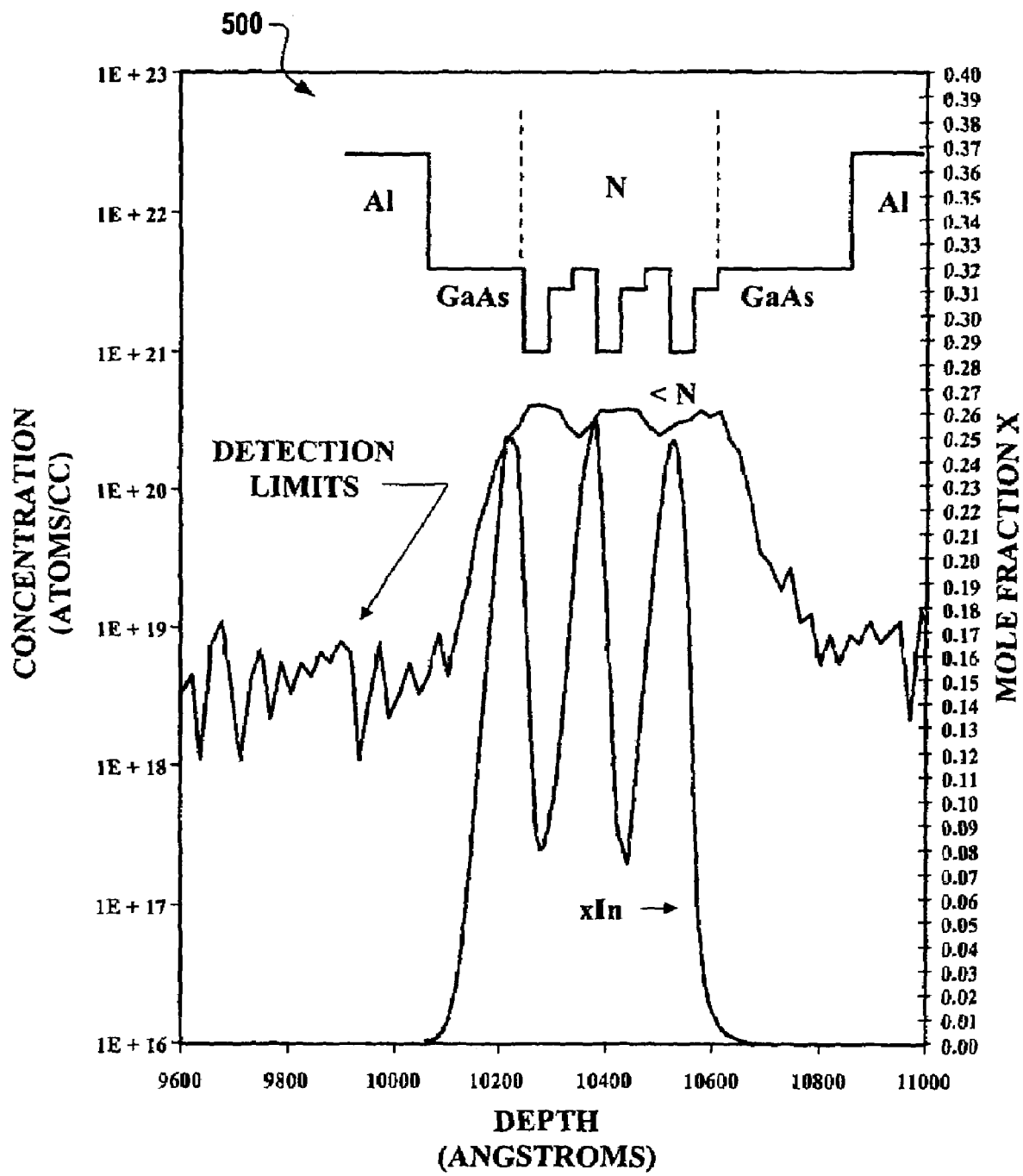
FIG. 35 is a graphical illustration of waveform associated with use of a device as illustrated in FIG. 33.

Referring to FIG. 35, an extended barrier enhanced device 500 is shown with the nitrogen profile, the drawing of the conduction band edge, and the indium. The graph is a close representation of the behavior of a device like the device illustrated in FIG. 33, shown transposed on the graph. The AlGaAs material does not overlap the nitrogen profile, except where it is at the background level of the SIMs instrument. In actual devices, a separation between the materials intentionally containing nitrogen and Al of from 128 to 200Å has been used.

Thus by following the teachings of the present invention a 1.3 micron wavelength VCSEL can be manufactured utilizing quantum wells of InGaAsN, or other semiconductor compounds, with gallium arsenide, or GaAsN mechanical stabilization layers in order to keep the semiconductor layers thin enough to maintain mechanical strain while utilizing common AlGaAs mirror structures.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface emitting laser (VCSEL) comprising:
    an active region having a first edge and a second edge, said active region further comprising at least one quantum well and at least one multi-component barrier, said at least one multi-component barrier layer disposed next to said at least one quantum well, wherein a portion of said at least one multi-component barrier layer comprises a reduced barrier energy to carrier flow near said at least one quantum well, thereby enhancing the speed and efficiency of the device; and
    first and second confinement regions each comprising at least one confinement layer, wherein said first confinement region is disposed next to and outside of said first edge of said active region and said second confinement region is disposed next to and outside of said second edge of said active region.

2. A VCSEL as defined in claim 1, wherein barrier energy to carrier flow is reduced immediately adjacent to said at least one quantum well on at least one of the input side or the output side of said at least one quantum well where said reduced barrier is located.

3. A VCSEL as defined in claim 2, wherein the quantum well portion of the active region comprises at least In, Ga, As, and N, and the barrier layer components comprise Ga, As, and N.

4. A VCSEL as defined in claim 2, wherein said at least one quantum well of said active region includes a reduced barrier layer only deployed on the carrier input side of said quantum well.

5. A VCSEL as defined in claim 2, wherein said at least one quantum well of said active region includes a reduced barrier layer only deployed on the carrier output side of said quantum well.

6. A VCSEL as defined in claim 1, wherein the active region includes layers formed using GaAs and at least one of In, N, P, or Sb.

7. A VCSEL as defined in claim 6, wherein the quantum well portion of the active region comprises at least In, Ga, As, and N, and the barrier layer components comprise Ga, As, and nitrogen.

8. A VCSEL as defined in claim 1, wherein the confining regions include layers formed using GaAs and Al.

9. A VCSEL as defined in claim 8, further comprising extended barrier layers disposed between said active region and said confining regions where nitrogen is used in the active region.

10. A VCSEL as defined in claim 1, further comprising at least one extended barrier layer disposed between said confinement regions and any barrier layers or quantum wells containing nitrogen and associated with said active region when said at least one confinement layers include Al.

11. A VCSEL as defined in claim 10, wherein said barrier layers include nitrogen.

12. A VCSEL as defined in claim 10, wherein said quantum wells include nitrogen.

13. A VCSEL as defined in claim 1, wherein said at least one quantum well further comprises layers of a semiconductor alloy under mechanical stress interspersed with thin layers of a substrate type material used in the device and said substrate type material layers serving as mechanical stabilizers for the semiconductor alloy layers to prevent the semiconductor alloy layers from relaxing.

14. A vertical cavity surface emitting laser (VCSEL), comprising:
an active region having a first edge and a second edge, said active region further comprising at least one quantum well containing nitrogen and at least one multi-component barrier, said at least one multi-component barrier layer disposed next to said at least one quantum well, said multi-component barrier layer further comprising a layer of GaAs disposed next to a layer of GaAsN, wherein a portion of said at least one multi-component barrier layer comprises a reduced barrier energy to carrier flow near said at least one quantum well, thereby enhancing the speed and efficiency of the device; and
first and second confinement regions further comprising at least one confinement layer, wherein said first confinement region is disposed next to and outside of said first edge of said active region and said second confinement region is disposed next to and outside of said second edge of said active region.

15. A VCSEL as defined in claim 14, wherein barrier energy to carrier flow is reduced immediately adjacent to said at least one quantum well on at least one of the input side and the output side of said at least one quantum well where said reduced barrier is located.

16. A VCSEL as defined in claim 15, wherein the quantum well portion of the active region comprises at least In, Ga, As, and N, and the GaAsN layer of said multi-component barrier layer includes at least one of In and Sb.

17. A VCSEL as defined in claim 15, wherein said at least one quantum well of said active region includes a reduced barrier layer only deployed on the carrier input side of said quantum well.

18. A VCSEL as defined in claim 16 wherein the quantum well portion of the active region comprises at least In, Ga, As, and N, and the barrier layer components comprise Ga, As, and nitrogen.

19. A VCSEL as defined in claim 14, wherein the confining regions includes layers formed using GaAs and Al.

20. A VCSEL as defined in claim 19, further comprising extended barrier layers disposed between said active region and said confining regions where nitrogen is used in the active region.

21. A VCSEL as defined in claim 14, further comprising at least one extended barrier layer disposed between said confinement regions and any barrier layers or quantum wells containing nitrogen and associated with said active region when said at least one confinement layers include Al.

22. A vertical cavity surface emitting laser (VCSEL) comprising:
an active region having a first edge and a second edge, said active region further comprising at least one quantum well containing nitrogen and at least one multi-component barrier, said at least one multi-component barrier layer disposed next to said at least one quantum well, said multi-component barrier layer further comprising a layer of GaAs disposed next to a layer of GaAsN, wherein a portion of said at least one multi-component barrier layer comprises a reduced barrier energy to carrier flow near said at least one quantum well, thereby enhancing the speed and efficiency of the device; and
first and second confinement regions further comprising at least one confinement layer including Al; and
an extended barrier layer disposed between said first confinement regions and said active region.

23. A VCSEL as defined in claim 22, wherein the quantum well portion of the active region comprises at least In, Ga, As, and N, and the GaAsN layer of said multi-component barrier layer includes at least one of In and Sb.

* * * * *

UNITED STATES PATENT AND TRADEMARK OFFICE
CERTIFICATE OF CORRECTION

PATENT NO. : 7,257,143 B2
APPLICATION NO. : 10/956798
DATED : August 14, 2007
INVENTOR(S) : Ralph H. Johnson It is certified that error appears in the above-identified patent and that said Letters Patent is hereby corrected as shown below:

Title Page
Item 57, line 9, change "barriers" to --barrier--
Item 57, line 9, delete "," after "gallium"
Item 57, line 10, delete "," after "arsenic"
Item 56, page 3, right column, References Cited, Other Publications, change "Huffacker" to --Huffaker--
Item 56, page 4, left column, References Cited, Other Publications, in Li, J. et al, change "$Ga_{1-x}$" to --$Ga_{1-x}$--

Column 7
Line 6, delete "and"
Line 40, make reference 22 bold font
Line 62-63, add --in-- after "52" and "51"

Column 8
Line 22, change "GaAsSbN" to --GaAsNSb--
Line 45, change "GaAsSbN" to --GaAsNSb--
Line 56, change "invention aspect 1" to --invention aspects--
Line 60, change "barriers" to --barrier--
Line 65, add --the-- after "of"

Signed and Sealed this

Ninth Day of March, 2010

David J. Kappos
*Director of the United States Patent and Trademark Office*